United States Patent
Lee et al.

(10) Patent No.: US 6,614,693 B1
(45) Date of Patent: Sep. 2, 2003

(54) COMBINATION ERASE WAVEFORM TO REDUCE OXIDE TRAPPING CENTERS GENERATION RATE OF FLASH EEPROM

(75) Inventors: Jian-Hsing Lee, Hsin-Chu (TW); Kuo-Reay Peng, Tainan (TW); Shui-Hung Chen, Hsin-Chu (TW); Jiaw-Ren Shih, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 2 days.

(21) Appl. No.: 10/100,752

(22) Filed: Mar. 19, 2002

(51) Int. Cl.$^7$ ............................................. G11C 16/04
(52) U.S. Cl. ........................ 365/185.29; 365/185.19; 365/185.26; 365/185.27
(58) Field of Search ........................ 365/185.19, 185.26, 365/185.27, 185.29, 185.33

(56) References Cited

U.S. PATENT DOCUMENTS

| | | | |
|---|---|---|---|
| 5,231,602 A | 7/1993 | Radjy et al. ............ | 365/185 |
| 5,357,476 A | 10/1994 | Kuo et al. .............. | 365/218 |
| 5,412,608 A | 5/1995 | Oyama ................... | 365/218 |
| 5,414,669 A | 5/1995 | Tedrow et al. .......... | 365/226 |
| 5,416,738 A | 5/1995 | Shrivastava ............. | 365/185 |
| 5,481,494 A | 1/1996 | Tang et al. ............. | 365/185.24 |
| 5,485,423 A | 1/1996 | Tang et al. ............. | 365/185 |
| 5,491,657 A | 2/1996 | Haddad et al. .......... | 365/185.27 |
| 5,521,866 A | 5/1996 | Akaogi ................... | 365/185.29 |
| 5,546,340 A | 8/1996 | Hu et al. ................ | 365/185.3 |
| 5,581,502 A | 12/1996 | Richart et al. .......... | 365/185.26 |
| 5,596,528 A | 1/1997 | Kaya et al. ............. | 365/185.24 |
| 5,598,369 A | 1/1997 | Chen et al. ............. | 365/185.27 |
| 5,726,933 A | 3/1998 | Lee et al. ............... | 365/185.18 |
| 5,760,605 A | 6/1998 | Go ......................... | 326/49 |
| 5,781,477 A | 7/1998 | Rinerson et al. ......... | 365/185.29 |
| 5,790,460 A | 8/1998 | Chen et al. ............. | 365/185.29 |
| 5,838,618 A | 11/1998 | Lee et al. ............... | 365/185.29 |
| 5,862,078 A | 1/1999 | Yeh et al. ............... | 365/185.29 |
| 5,903,499 A | 5/1999 | Peng et al. ............. | 365/185.29 |
| 5,914,896 A | * 6/1999 | Lee et al. ............... | 365/185.19 |
| 5,949,717 A | 9/1999 | Ho et al. ................ | 365/185.29 |
| 6,049,484 A | 4/2000 | Lee et al. ............... | 365/185.29 |
| 6,049,486 A | 4/2000 | Lee et al. ............... | 365/185.33 |
| 6,055,183 A | 4/2000 | Ho et al. ................ | 365/185.09 |

* cited by examiner

Primary Examiner—Son Mai
(74) Attorney, Agent, or Firm—George O. Saile; Stephen B. Ackerman; Billy Knowles

(57) ABSTRACT

A combination erase method to erase data from a flash EEPROM eliminates electrical charges trapped in the tunneling oxide of a flash EEPROM to maintain proper separation of the programmed threshold voltage and the erased threshold voltage after extended programming and erasing cycles. A first embodiment method to erase a flash EEPROM cell begins by negative gate erasing to remove charges from the floating gate, followed by a source erasing to further remove charges from the floating gate, and finally followed by a channel erasing to detrap charges. A second embodiment begins with a negative gate erasing having a incremental stepping of the voltages to remove the charges from the floating gate. This followed by a source erasing to detrap the tunneling oxide of the EEPROM cell. A third embodiment begins with a source erasing having a incremental stepping of the voltages to remove the charges from the floating gate. This followed by a channel erasing to detrap the tunneling oxide of the EEPROM cell.

72 Claims, 14 Drawing Sheets

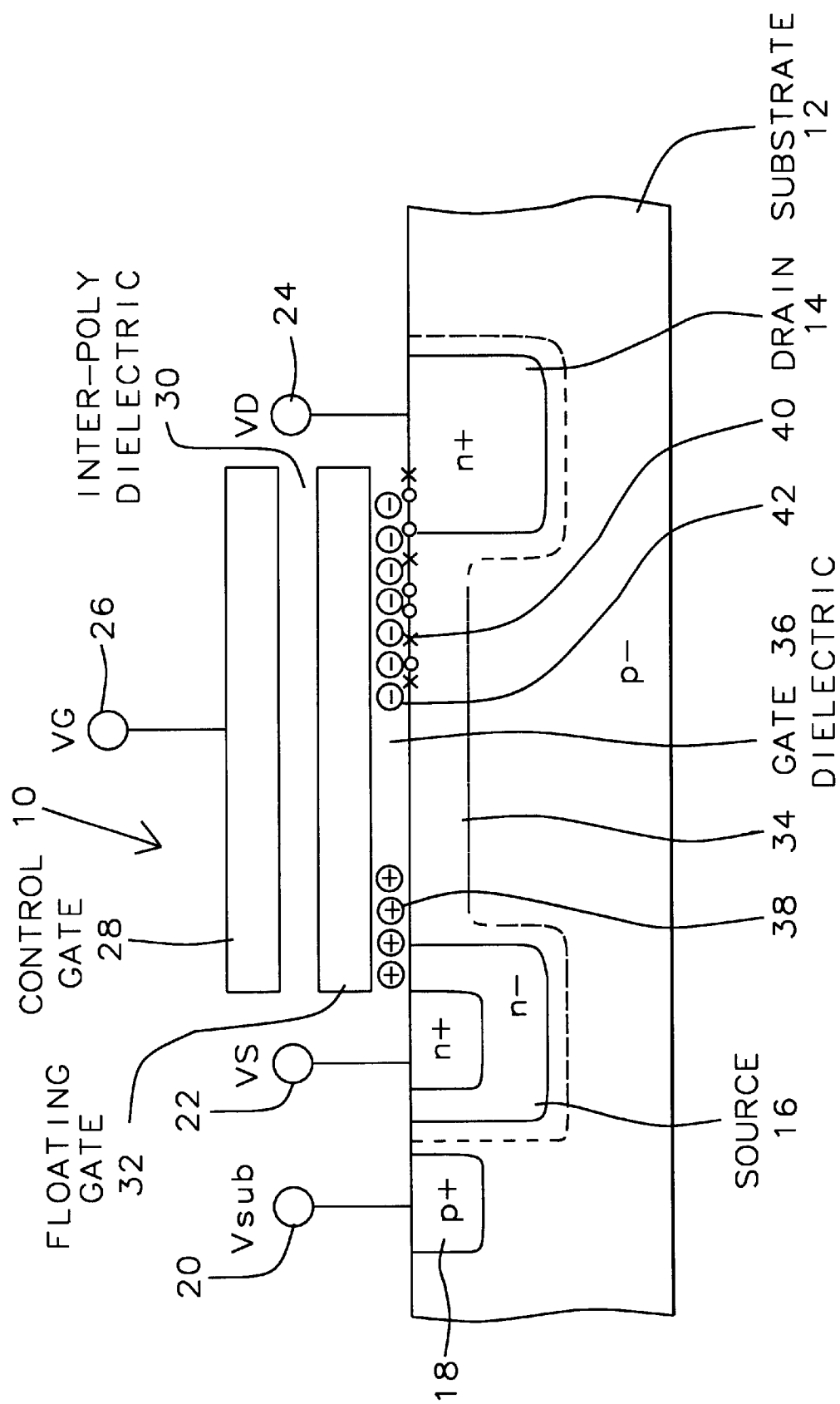
FIG. 1a – Prior Art

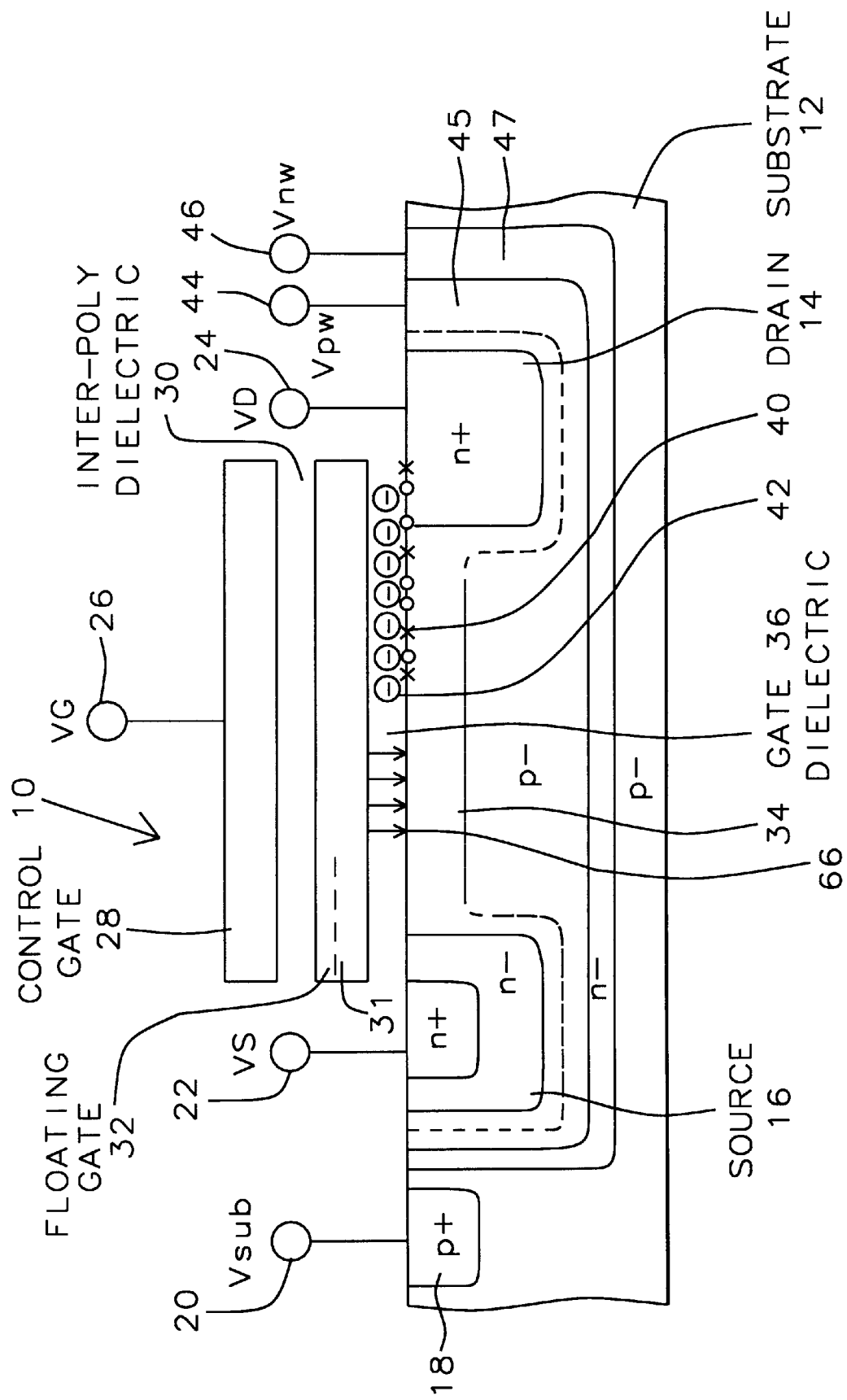
FIG. 1b – Prior Art

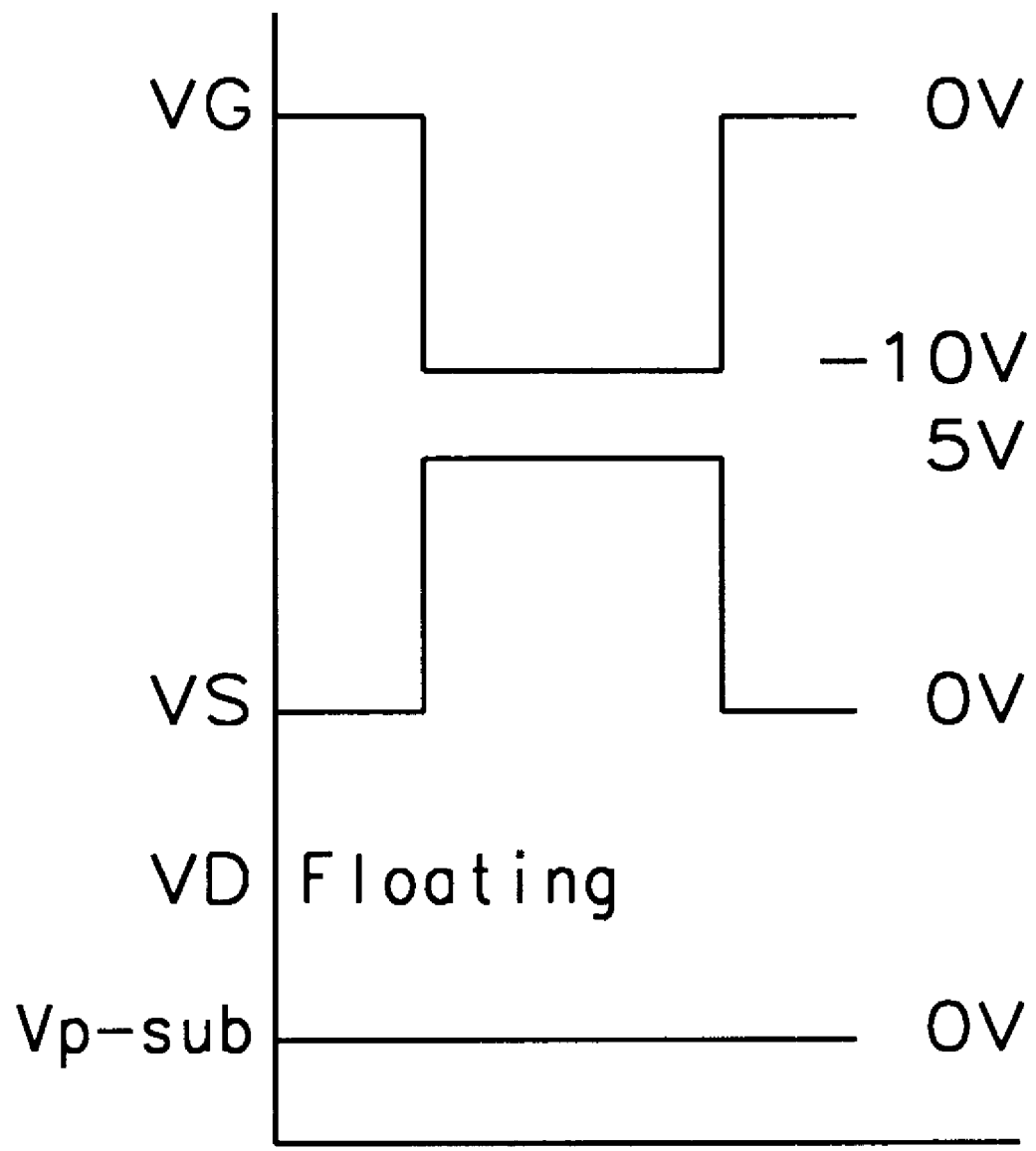
FIG. 2a – Prior Art

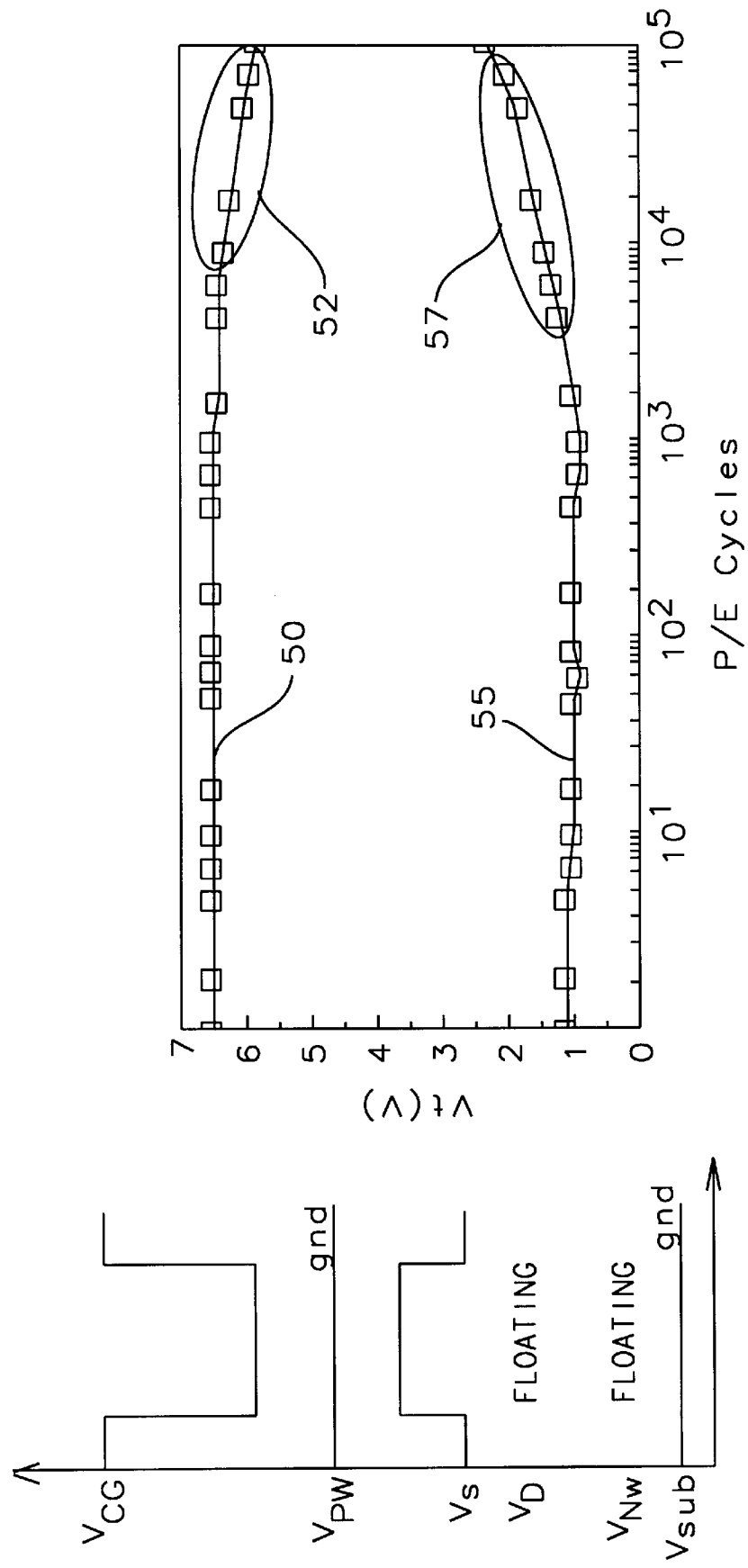
FIG. 2b – Prior Art    FIG. 2c – Prior Art

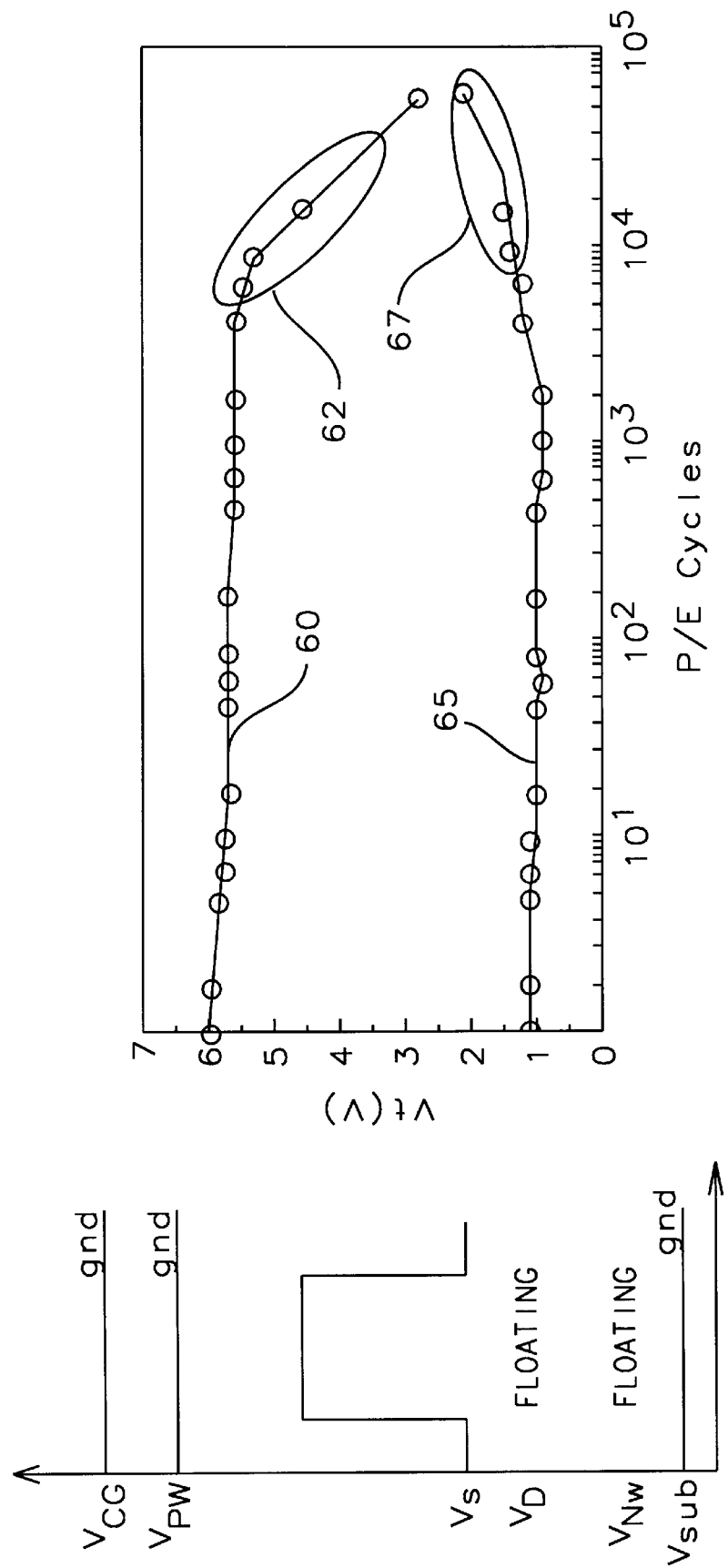
FIG. 3b – Prior Art
FIG. 3a – Prior Art

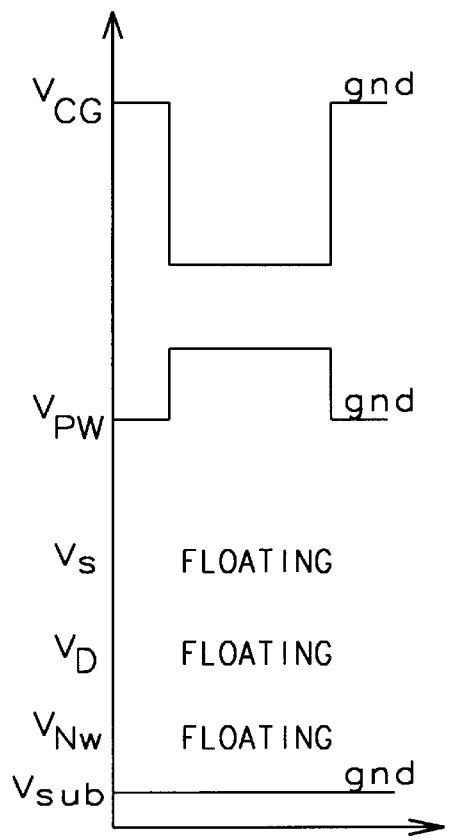
*FIG. 4a - Prior Art*
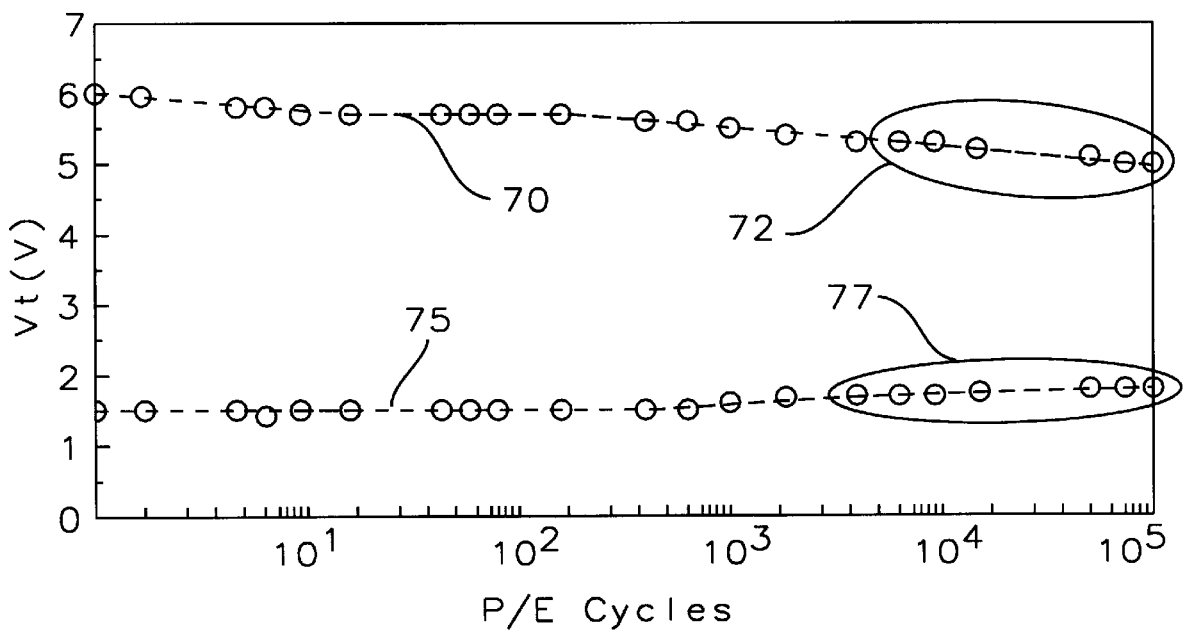
*FIG. 4b - Prior Art*

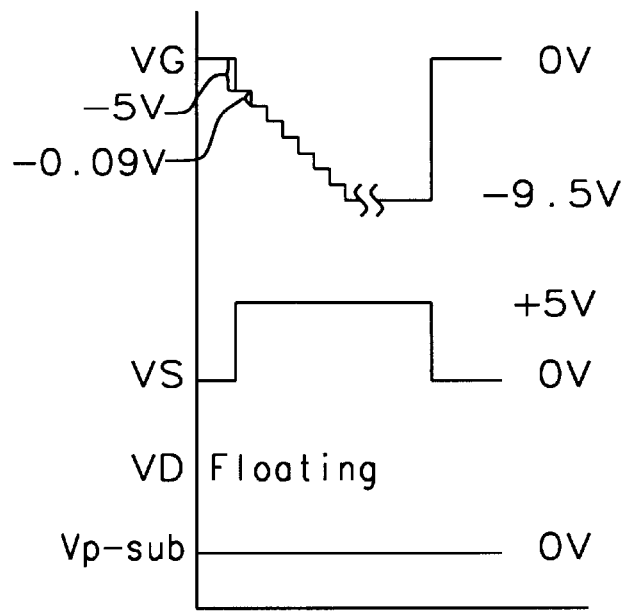
*FIG. 5*
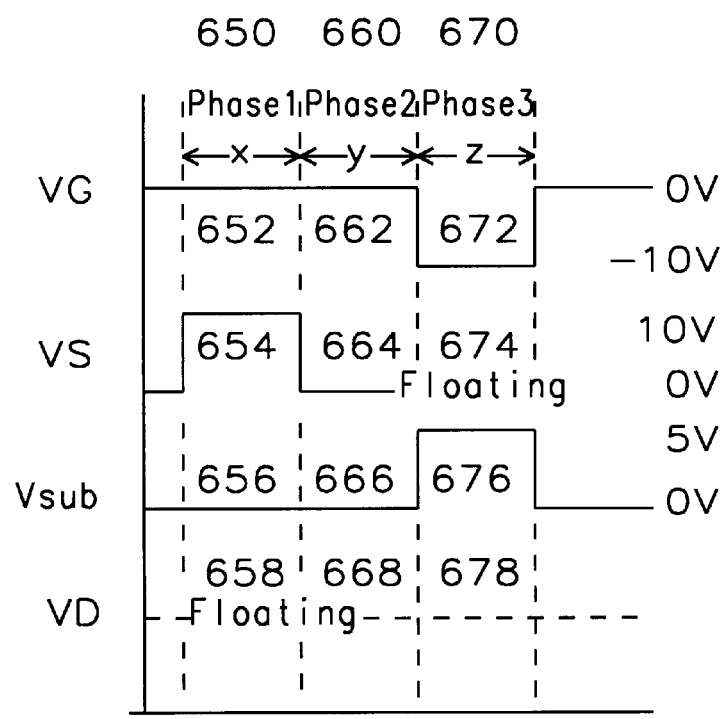
*FIG. 6a – Prior Art*

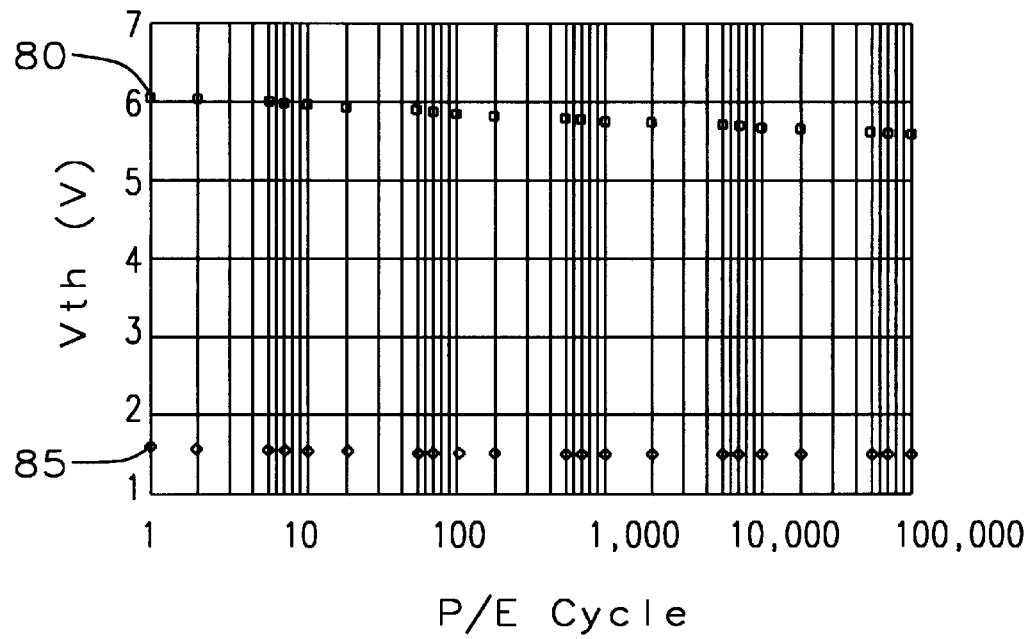
FIG. 6b - Prior Art
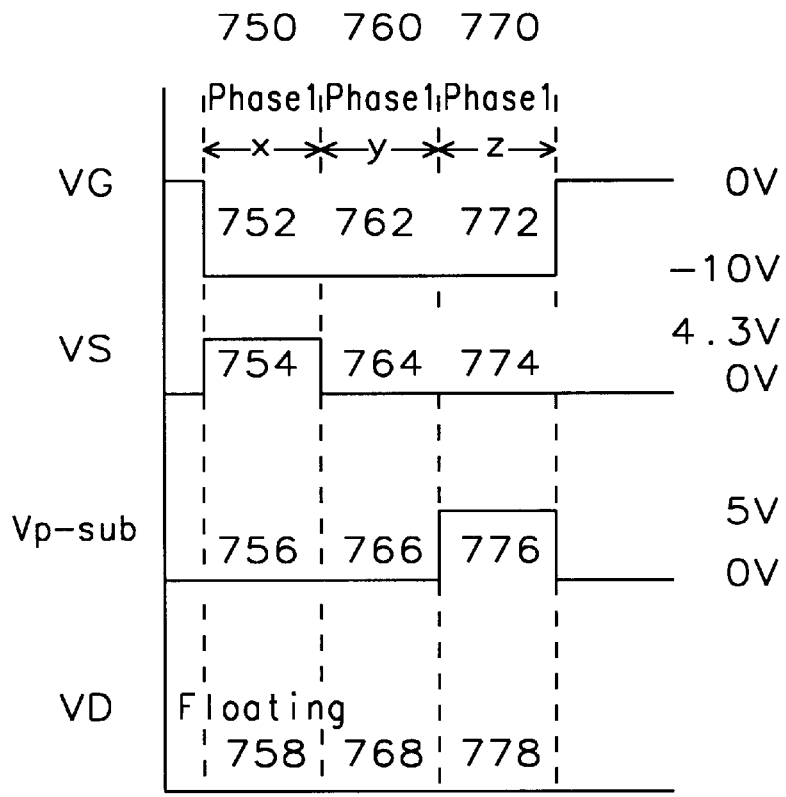
FIG. 7a - Prior Art

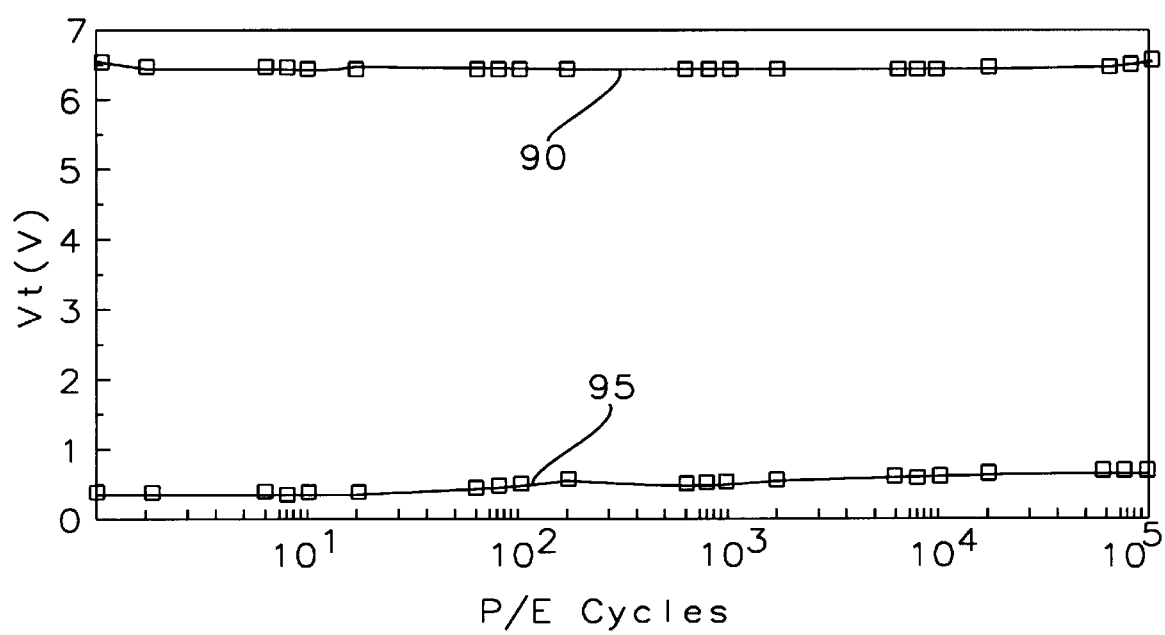
FIG. 7b – Prior Art

COMBINATION ERASE WAVEFORM TO REDUCE OXIDE TRAPPING CENTERS GENERATION RATE OF FLASH EEPROM

RELATED PATENTS

U.S. Pat. No. 6,055,183, Issued Apr. 25, 2000, "A Novel Erase Method Of Flash EEPROM By Using Snapback Characteristic," assigned to the Same Assignee as the present invention.

U.S. Pat. No. 6,049,486, issued September Apr. 11, 2000, "A Triple Mode Erase Scheme for Improving Flash EEPROM Cell Threshold Voltage ($V_T$) Cycling Closure Effect," assigned to the Same Assignee as the present invention.

U.S. Pat. No. 6,049,484, issued Apr. 11, 2000, "An Erase Method to Improve Flash EEPROM Endurance by Combining High Voltage Source Erase and Negative Gate Erase," assigned to the Same Assignee as the present invention.

U.S. Pat. No. 5,949,717, issued Sep. 7, 1999, "A Novel Method to Improve Flash EEPROM Write/Erase Threshold Closure," assigned to the Same Assignee as the present invention.

U.S. Pat. No. 5,903,499, issued May 11, 1999, "A Novel Method to Erase A Flash EEPROM Using Negative Gate Source Erase Followed By a High Negative Gate Erase," assigned to the Same Assignee as the present invention.

U.S. Pat. No. 5,838,618, issued November 17, 1998, "A Bi-Modal Erase Method for Eliminating Cycling-Induced Flash EEPROM Cell Write/Erase Threshold Closure," assigned to the Same Assignee as the present invention.

U.S. Pat. No. 5,862,078, issued Jan. 19, 1999, "A Mixed Mode Erase Method To Improve Flash EEPROM Write/ Erase Threshold Closure," assigned to the Same Assignee as the present invention.

BACKGROUND OF THE INVENTION

1. Field of the Invention

This invention relates generally to a class of non-volatile memory devices referred to as flash electrically erasable programmable read-only memory (flash EEPROM). More particularly, this invention relates to methods and means to erase digital data from a flash EEPROM cell and for eliminating trapped charges from the flash EEPROM cell to prevent closure of the difference of the programmed threshold voltage and the erase threshold voltage of the flash EEPROM cell.

2. Description of Related Art

The structure and application of the flash EEPROM is well known in the art. The Flash EEPROM provides the density advantages of an erasable programmable read-only memory (EPROM) that employs ultra-violet light to eliminate the programming with the speed of a standard EEPROM. FIG. 1a illustrates a cross-sectional view of a flash EEPROM cell of the prior art. The flash EEPROM cell 10 is formed within a p-type substrate 12. An $n^+$ drain region 14 and an $n^+$ source region 16 are formed within the p-type substrate 12.

A relatively thin gate dielectric 36 is deposited on the surface of the p-type substrate 12. The thin gate dielectric 36 will also be referred to as a tunneling oxide, hereinafter. A poly-crystalline silicon floating gate 32 is formed on the surface of the gate dielectric 36 above the channel region 34 between the drain region 14 and source region 16. An interpoly dielectric layer 30 is placed on the floating gate 32 to separate the floating gate 32 from a second layer of poly-crystalline silicon that forms a control gate 28.

A $p^+$ diffusion 18 is placed in the p-type substrate 12 to provide a low resistance path from a terminal 20 to the p-type substrate. The terminal 20 will be attached to a substrate voltage generator Vsub. In most application of an EEPROM, the substrate voltage generator Vsub is set to the ground reference potential (0V).

The source region 16 is connected to a source voltage generator VS through the terminal 22. The control gate 28 will be connected through the terminal 26 to the control gate voltage generator VG. And the drain region 14 will be connected through the terminal 24 to the drain voltage generator VD.

According to conventional operation, the flash EEPROM cell 10 is programmed by setting the gate control voltage generator VG to a relatively high voltage (on the order of 10V). The drain voltage generator VD is set to a moderately high voltage (on the order of 5V), while the source voltage generator VS is set to the ground reference potential (0V).

With the voltages as described above, hot electrons will be produced in the channel 34 near the drain region 14. These hot electrons will have sufficient energy to be accelerated across the gate dielectric 36 and trapped on the floating gate 32. The trapped hot electrons will cause the threshold voltage of the field effect transistor (FET) that is formed by the flash EEPROM cell 10 to be increased by three to five volts. This change in threshold voltage by the trapped hot electrons causes the cell to be programmed.

During the programming process, some of the hot electrons will be trapped 42 in the tunneling oxide 36 or in surface states 40 at the surface of the p-type substrate 12. These trapped electrons will cause the threshold voltage of the erased flash EEPROM cell 10 to increase.

To erase the flash EEPROM cell 10 as described in U.S. Pat. No. 5,481,494(Tang et al.), as shown in FIG. 2a, a moderately high positive voltage (on the order of 5V) is generated by the source voltage generator VS. Concurrently, the gate control voltage generator VG is set to a relatively large negative voltage (on the order of –10V). The substrate voltage generator VS are set to the ground reference potential. The drain voltage generator VD is usually disconnected from the terminal 24 to allow the drain region 14 to float. Under these conditions there is a large electric field developed across the tunneling oxide 36 in the source region 16. This field causes the electrons trapped in the floating gate 32 to flow to portion of the floating gate 32 that overlaps the source region 16. The electrons are then extracted to the source region 16 by the Fowler-Nordheim tunneling.

Further Tang et al. shows a method for tightening the threshold voltage $V_T$ distribution of an array of flash EEPROM cells. The moderately high positive voltage (5V) that is applied to the source regions of the array of flash EEPROM cells and the relatively large negative voltage that is applied to the control gate insure a tighter distribution of the thresholds of the array of cells. The value of a load resistor between the low positive voltage and the source region is simultaneously reduced to a predetermined value so as to compensate for the increased erase time caused by the lowering of the magnitude of the negative constant voltage.

Referring back to FIG. 1a during the erasure process, as a result of band to band tunneling, some positive charges or "hot holes" 38 will be forced and trapped in the tunneling oxide 36. These trapped positive charges or "hot holes" 38 will cause the threshold voltage of the programmed flash EEPROM cell 10 to decrease. As can be shown in FIG. 2e, after repeatedly performing write/erase cycling, the combination of the decrease 52 in the programmed threshold voltage 50 and the increase 57 in the erased threshold voltage 55 will cause the separation of the programmed threshold voltage 50 and the erased threshold voltage 55 to close until the flash EEPROM cell 10 fails. At this time, the flash EEPROM will no longer be able to operate reliably to store digital data.

FIG. 1b illustrates an alternate cross-sectional view of a flash EEPROM cell of the prior art. The flash EEPROM cell 10 is formed within a P-type substrate 12. An N-type material is implanted within the P-type substrate 12 to a lightly doped concentration to for the N-well 47. Within the N-well 47, a P-type material is implanted to a lightly doped concentration to form the P-well 45. An $N^+$ drain region 14 and an $N^{30}$ source region 16 are formed within the P-type well 45.

A relatively thin gate dielectric 36 is deposited on the surface of the P-type substrate 12. The thin gate dielectric 36 will also be referred to as a tunneling oxide, hereinafter. A poly-crystalline silicon floating gate 32 is formed on the surface of the gate dielectric 36 above the channel region 34 between the drain region 14 and source region 16. An interpoly dielectric layer 30 is placed on the floating gate 32 to separate the floating gate 32 from a second layer of poly-crystalline silicon that forms a control gate 28.

A P+ diffusion 18 is placed in the P-type substrate 12 to provide a low resistance path from a terminal 20 to the P-type substrate. The terminal 20 will be attached to a substrate voltage generator VSub. In most application of an EEPROM, the substrate voltage generator VSub will be set to the ground reference potential (0V).

The source region 16 will be connected to a source voltage generator VS through the terminal 22. The control gate 28 will be connected through the terminal 26 to the control gate voltage generator VG. And the drain region 14 will be connected through the terminal 24 to the drain voltage generator VD. The P-well 45 is connected to a P-well voltage generator VPw through terminal 44. The N-well 47 is connected to the N-well voltage generator VNw through the terminal 46.

According to conventional operation, the flash EEPROM cell 10 is programmed by setting the gate control voltage generator VG to a relatively high positive voltage (on the order of 10V). The drain voltage generator VD is set to a moderately high voltage (on the order of 5V), while the source voltage generator VS and the P-well voltage generator VPw are set to the ground reference potential (0V). The N-well voltage generator VNw is disconnected from the terminal 46 to allow the N-well 47 to float.

With the voltages as described above, hot electrons will be produced in the channel 34 near the drain region 14. These hot electrons will have sufficient energy to be accelerated across the gate dielectric 36 and trapped on the floating gate 32. The trapped hot electrons will cause the threshold voltage of the field effect transistor (FET) that is formed by the flash EEPROM cell 10 to be increased by three to five volts. This change in threshold voltage by the trapped hot electrons causes the cell to be programmed.

During the programming process, some of the hot electrons will be trapped 42 in the tunneling oxide 36 or in surface states 40 at the surface of the P-type substrate 12. These trapped electrons will cause the threshold voltage of the erased flash EEPROM cell 10 to increase.

U.S. Pat. No. 5,481,494 (Tang et al. 494), U.S. Pat. No. 5,485,423 (Tang et al. 423), U.S. Pat. No. 5,412,608 (Oyama), U.S. Pat. No. 5,414,669 (Tedrow et al.), U.S. Pat. No. 5,790,460 (Chen et al.), U.S. Pat. No. 5,416,738 (Shrivasta), U.S. Pat. No. 5,546,340 (Hu et al.), and U.S. Pat. No. 5,781,477 (Rinerson et al.) each describe a form of erasing a flash EEPROM conventionally referred to as Negative Gate Erase. To erase the flash EEPROM cell 10 using Negative Gate Erase, as shown in FIG. 2b, a moderately high positive voltage (on the order of 5V) is generated by the source voltage generator VS. Concurrently, the gate control voltage generator VG is set to a relatively large negative voltage (on the order of −10V). The substrate voltage generator VSub and the P-well voltage generator VPw are set to the ground reference potential. The drain voltage generator VD and the N-well voltage generator VNw are respectively usually disconnected from the terminal 24 to allow the drain region 14 to float from the terminal 44 to allow the N-well 47 to float. Under these conditions there is a large electric field developed across the tunneling oxide 36 in the source region 16. This field causes the electrons trapped in the floating gate 32 to flow to portion of the floating gate 32 that overlaps the source region 16. The electrons are then extracted to the source region 16 by the Fowler-Nordheim tunneling.

Referring back to FIG. 1b, during the erasure process, because of band to band tunneling, some positive charges or "hot holes" 38 are forced into the tunneling oxide 36 and trapped there in the tunneling oxide 36. Further, defects 40 at the interface of the tunneling oxide 36 and the P-well 45 will create trapped positive charges. These trapped positive charges or "hot holes" 38 and the interface traps 40 will cause the threshold voltage of the programmed flash EEPROM cell 10 to decrease. As can be shown in FIG. 2c, after repeatedly performing write/erase cycling, the combination of the decrease 52 in the programmed threshold voltage 50 and the increase 57 in the erased threshold voltage 55 will cause the separation of the programmed threshold voltage 50 and the erased threshold voltage 55 to close until the flash EEPROM cell 10 fails. At this time, the flash EEPROM will operate less reliably to store digital data.

Further Tang et al. 494 shows a method for tightening the threshold voltage $V_T$ distribution of an array of flash EEPROM cells. The moderately high positive voltage (5V) that is applied to the source regions of the array of flash EEPROM cells and the relatively large negative voltage that is applied to the control gate insure a tighter distribution of the thresholds of the array of cells. The value of a load resistor between the low positive voltage and the source region is simultaneously reduced to a predetermined value so as to compensate for the increased erase time caused by the lowering of the magnitude of the negative constant voltage.

A variant of the negative gate erase is the positive gate erase discussed in U.S. Pat. No. 5,760,605 (Go). In Go the control gate is brought to a voltage level of approximately +11.0V and the source is brought to the ground reference potential. These biasing conditions allow a net negative potential to be "stored" on the floating gate to establish the "erased" condition. For programming of the flash EEPROM cell the control gate is brought to the ground reference potential, the drain is brought to a voltage of approximately +13.0V and the source is brought to approximately +11.0V. A net positive potential is thus "stored" on the floating gate to establish the "programmed" condition.

Oyama and Hu et al. further discuss techniques for equalization of the threshold voltage $V_T$ after erase or correction of over erase conditions.

U.S. Pat. No. 5,596,528 (Kaya et al.), U.S. Pat. No. 5,491,657 (Haddad et al.), U.S. Pat. No. 5,357,476 (Ku et al.), U.S. Pat. No. 5,598,369 (Chen et al.), U.S. Pat. No. 5,581,502 (Richert et al.), U.S. Pat. No. 5,726,933 (Lee et al. 933) and Hu et al. each describe a form of erasing the flash EEPROM cell 10 conventionally referred to as a Source Erase. To erase the flash EEPROM cell 10 using Source Erase, as shown in FIG. 3a, a relatively high positive voltage (on the order of +10.0V) is generated by the source voltage generator Vs. The control gate voltage generator VG, the P-well voltage generator VPw, and the substrate voltage generator VSub are each set to the ground reference potential. The drain voltage generator VD and the N-well voltage generator VNw are generally disconnected respectively form the drain region 14 and the N-well 47 to allow the drain region 14 and the N-well 47 to be floating. Under these biasing conditions there is similarly a large electric field is developed across the tunneling oxide 36 the source region 16. This electric field causes the electrons 31 trapped in the floating gate 32 to be extracted to the source region 16 by the Fowler-Nordheim tunneling.

FIG. 3b shows the threshold voltage $V_T$ versus the number of repeated program/erase cycles of the flash EEPROM. As described above, the "hot holes" 38 and the interface traps 40 of FIG. 1 create positive charges that raise the threshold voltage $V_T$ of the flash EEPROM cell. The combination of the decrease 62 in the programmed threshold 60 and the increase 67 of the erased threshold voltage 65 causes the separation of the programmed threshold voltage 60 and the erase threshold voltage 65 to close until the flash EEPROM cell fails. At this time, the flash EEPROM cell will no longer be able to retain the digital data reliably.

U.S. Pat. No. 5,231,602 (Radjy et al.) describes a method of erasing a flash EEPROM cell by controlling the electric field across the tunneling oxide. The drain is connected through a variable resistor to a programming voltage source and a variable voltage source is connected to the source. The variable voltage source is adjusted between 0 and 5V, while the programming voltage source is set between 5V and 20V. The tunneling. current is optimized by adjustment of the variable resistor and the variable voltage.

A third method of erasure of a flash EEPROM cell is described in U.S. Pat. No. 5,521,866 (Akaogi) and is termed a Channel Erase. Channel Erase, as shown in FIG. 4a, has the control gate voltage generator VG set to a relatively large negative voltage (−10.0V) to place the control gate 28 at the relatively large negative voltage. The P-well voltage generator VPw is set to a moderately high voltage (+5.0V) to set the P-well 45 to the moderately high voltage.

The source 16, the drain 14, and the N-well are respectively disconnected from the source voltage generator Vs, the drain voltage generator VD, and the N-well voltage generator VNw to cause the source 16, the drain 14, and the N-well to be floating. The substrate voltage generator VSub is set to the ground reference potential so that the substrate is biased to the ground reference potential.

FIG. 4b illustrates the degradation of the programmed threshold voltage 70 and the erased threshold voltage 75 as the cumulative number of program/erase cycles of the flash EEPROM is increased. In the Channel Erase, the negative charges 31 are extracted across the surface of the floating gate 32 through the tunneling oxide 36 to the P-well 45. Some of these charges will be trapped in the tunneling oxide 36. As the number of program/erase cycles is increase, the programmed threshold voltage 70 begins to decrease 72, while the erased threshold voltage 75 increases modestly 77. This indicates that eventually the difference between the programmed threshold voltage 70 and the erased threshold voltage 75 will eventually decrease until the flash EEPROM cell 10 can no longer retain digital data reliably.

Tang et al. 423 as shown in FIG. 5, describes a method of erasure of a flash EEPROM. A moderately large positive voltage pulse (+5.0V) is generated by the source voltage generator VS. Simultaneously, a negative ramp voltage is developed by the gate control voltage generator VG. The negative ramp voltage has a first incremental voltage of approximately −5.0V and each of the following increments is −0.9V. The maximum voltage generated by the gate control voltage generator VG is approximately −9.5V. The drain voltage generator VG will be disconnected from the drain to allow the drain to float and the substrate voltage generator will be set to the ground reference potential as above described. This method will achieve an averaging of the tunneling field during the entire erase cycle.

U.S. Pat. No. 5,949,717 (Ho et al.), assigned to the Same Assignee as the present invention, and "Using Erase Self-Detrapped Effect To Eliminate the Flash Cell Program/Erase Cycling $V_{th}$ Window Close" Lee, et al., Proceedings 37th Annual IEEE International Reliability Symposium, IEEE, March 1999, pp. 24–29, describes, what is termed, a source erase followed by a channel erase. Referring to FIGS. 1a and 6a, the initial period of the erase cycle (phase 1) or erasure phase 650 starts by setting the gate control voltage generator VG 26 and thus the control gate to the ground reference potential (0V) 652. The source voltage generator VS 22 and consequently the source region 18 will be set to a relatively high voltage (approximately 10V) 654. The substrate voltage generator Vsub 20 and thus the p-type substrate 2 will be set to the ground reference potential (0V) 656. The drain voltage generator VD 24 will be disconnected from the drain region 14 to be floating 658. The voltages as described will force the trapped charges on the floating gate 30 of the flash EEPROM cell 10 to migrate to the end of the floating gate 30 immediately above the source region 18. The electric field in the tunnel oxide 36 will force these trapped electrons to flow through the tunnel oxide 36 by the Fowler-Nordheim tunneling into the source region 18. At the completion of the phase 1 650 there will be positive charges 38 remaining in the tunnel oxide 36 as described above. Additionally there will be electrons 42 that have been trapped in the tunnel oxide 36 and at the surface states 40, again as described above.

A second phase (phase 2) 660 will terminate the erase cycle by bringing the source voltage generator VS 22 to the ground reference potential (0V). The gate control voltage generator VG 26 and the substrate voltage generator Vsub 20 will remain at the ground reference potential (0V) 662 and 666. The drain voltage generator VD 24 will remain disconnected from the drain region 24 to keep the drain region 24 floating 668.

Having terminated the erasure phase 650 in phase 2 660, the detrapping phase (phase 3) can begin. The gate control voltage generator VG 26 is brought to a relatively large negative voltage (−10V) 672. Concurrently, the source voltage generator VS 22 is disconnected from the source region 18 to allow the source region 18 to float 674. Also concurrently, the substrate voltage generator Vsub 20 and thus the p-type substrate 2 will be brought to a moderately large positive voltage (+5V) 676. At this time the drain voltage generator VD 24 will remain disconnected from the drain region 14 thus maintaining the drain region 14 at a floating condition 678.

The range of the source voltage generator VS 22 will be from 5.0V to 15V. The range of the gate control voltage generator VG 26 is from −5.0V to −15.0, and the range of the substrate voltage generator Vsub 20 is from 0.5V to the value of the power supply voltage source or about 5.0V.

The relative period of time x for the phase 1 650, of the erase cycle is 50 msec. in duration but can range from 10 msec. to 100 msec. Phase 2 660 and Phase 3 670 have periods of time y and z are approximately 30 and 50 msec. in duration respectively. The range in duration z of phase 3 670 is from 10 msec. to 100 msec. Additionally the phase 3 670 would normally be practiced at every erase cycle. However, the phase 3 670 could be practiced periodically to eliminate trapped charges.

Referring to FIG. 6b, the programmed threshold voltage 80 will remain at a relatively constant value of approximately 6V for at least 100,000 program/erase cycles. Also, as can be seen, the erased threshold voltage 85 will remain at a constant value of approximately 0.5V for the 100,000 program/erase cycles. By not degrading the threshold as seen in FIG. 2c, the flash EEPROM cell 10 of FIG. 1a will maintain operation without failure for program/erase cycle in excess of 100,000 cycles.

Further, the March 1999 IEEE Reliability Symposium Paper by Lee, et al. describes, what is termed, a negative gate erase followed by a channel erase. Referring to FIGS. 1a and 7a, the initial period of the erase cycle (phase 1) or erasure phase 750 starts by setting the gate control voltage generator VG 26 and thus the control gate to a relatively large negative voltage (−10V) 752. The source voltage generator VS 22 and consequently the source region 18 will be set to a moderately high voltage (approximately 4.3V) 754. The substrate voltage generator Vsub 20 and thus the p-type substrate 12 will be set to the ground reference potential (0V) 756. The drain voltage generator VD 24 will be disconnected from the drain region 14 to be floating 758. The voltages as described will force the trapped charges on the floating gate 30 of the flash EEPROM cell 10 to migrate to the end of the floating gate 30 immediately above the source region 18. The electric field in the tunnel oxide 36 will force these trapped electrons to flow through the tunnel oxide 36 by the Fowler-Nordheim tunneling into the source region 18. At the completion of the phase 1 750 there will be positive charges 38 remaining in the tunnel oxide 36 as described above. Additionally there will be electrons 42 that have been trapped in the tunnel oxide 36 and at the surface states 40, again as described above.

A second phase (phase 2) 760 will terminate the erase cycle by bringing the source voltage generator VS 22 to the ground reference potential (0V) 764. The gate control voltage generator VG 26 will remain at the relatively large negative voltage (−10V) 762. The substrate voltage generator Vsub 20 will remain at the ground reference potential (0V) 766. The drain voltage generator VD 24 will remain disconnected from the drain region 24 to keep the drain region 24 floating 768.

Having terminated the erasure phase 750 in phase 2 760, the detrapping phase (phase 3) 770 can begin. The gate control voltage generator VG 26 remains at the relatively large negative voltage (−10V) 772. Concurrently, the source voltage generator VS 22 20 will remain at the ground reference potential (0V) 774. Also concurrently, the substrate voltage generator Vsub 20 and thus the p-type substrate 12 will be brought to a moderately large positive voltage (+5V) 776. At this time the drain voltage generator VD 24 will remain disconnected from the drain region 14 thus maintaining the drain region 14 at a floating condition 778.

The range of the source voltage generator VS 22 will be from 0V to 10V preferably 4.3V. The range of the gate control voltage generator VG 26 is from −5.0V to −15.0, preferably −10.0V, and the range of the substrate voltage generator Vsub 20 is from 0.5V to the value of the power supply voltage source or about 5.0V.

The relative period of time x for the phase 1 750, of the erase cycle is 50 msec. in duration but can range from 10 msec. to 100 msec. Phase 2 760 and Phase 3 770 have time periods y and z are approximately 30 and 50 msec. in duration respectively. The range in duration z of phase 3 770 is from 10 msec. to 100 msec. Additionally the phase 3 770. would normally be practiced at every erase cycle. However, the phase 3 770 could be practiced periodically to eliminate trapped charges.

Referring to FIG. 7b, the programmed threshold voltage 90 will remain at a relatively constant value of approximately 6V for at least 100,000 program/erase cycles. Also, as can be seen, the erased threshold voltage 95 will remain at a constant value of approximately 0.5V for the 100,000 program/erase cycles. By not degrading the threshold as seen in FIG. 2c, the flash EEPROM cell 10 of FIG. 1a will maintain operation without failure for program/erase cycle in excess of 100,000 cycles.

The remaining related patent applications, included herein by reference, illustrate methods to improve the difference in the programmed threshold voltage and the erased threshold voltage by dual phase erasing methods eliminating charges from the floating gate and detrapping the charges from the tunneling oxide of the flash EEPROM cell.

SUMMARY OF THE INVENTION

An object of this invention is to provide a method for the erasure of data from a flash EEPROM.

Another object of this invention is to provide a method to eliminate electrical charges trapped in the tunneling oxide and within surface states at the interface of the semiconductor substrate.

Further an other object of this invention is to eliminate electrical charges trapped in the tunneling oxide of a flash EEPROM to maintain proper separation of the programmed threshold voltage and the erased threshold voltage after extended programming and erasing cycles.

To accomplish these and other objects a first embodiment of a combination method to erase a flash EEPROM cell begins by negative gate erasing the flash EEPROM to remove charges from the floating gate. The negative gate erasing begins by first applying a first relatively large negative voltage pulse to the control gate of the flash EEPROM. The first relatively large negative voltage pulse has a voltage of from approximately −5.0V to approximately −15.0V, preferably −10.0V.

Concurrently a first moderately large positive voltage pulse is applied to the source. The first moderately large positive voltage pulse has a voltage of from approximately +0.5V to approximately +5.0V, preferably +4.3V.

Also, concurrently a ground reference potential is applied to the first well and the semiconductor substrate, and the drain and second well are disconnected to allow the drain and second well to float.

At the completion of the negative gate erasing, the flash EEPROM cell is then source erased to further remove charges from the floating gate. The source erase procedure begins by floating the drain and the second well and concurrently applying the ground reference potential to the semiconductor substrate, the drain, and the first well. Simultaneously, a relatively large positive voltage pulse is applied to the source. The relatively large positive voltage pulse as a voltage of from approximately +5.0V to approximately +15.0V, preferably 10.0V.

Upon completion of the source erasing, the flash EEPROM is then channel erased to detrap charges from the tunneling oxide. The channel erase begins by applying a second relatively large negative voltage pulse to the control gate of the EEPROM cell and concurrently applying a second moderately large positive voltage pulse to the first well. The second relatively large negative voltage pulse has a voltage of from approximately −5.0V to approximately −15.0V, preferably −10.0V and the second moderately large positive voltage pulse has a voltage of from approximately +0.5V to approximately +5.0V, preferably +5.0V.

At this same time, a ground reference potential is applied to the semiconductor substrate and the drain, the source, and the second well are floated.

The detrapping the flash EEPROM allows a separation of a programmed threshold voltage from an erased threshold voltage to be maintained over the repeated writing and erasing of the flash EEPROM, thus improving the program/erase threshold voltage closure.

The first moderately large positive voltage pulse, the second moderately large positive voltage pulse, the first relatively large negative voltage pulse, relatively large positive voltage pulse, and the second relatively large negative voltage pulse each have a duration of approximately 10 m second to two seconds.

The duration of the second moderately large positive pulse and the second relatively large negative pulse will prevent degradation to the tunneling oxide during the source erasing due to a lesser electric field in the tunneling oxide.

A second embodiment of a combination method to erase a flash EEPROM cell begins by negative gate erasing the flash EEPROM to detrap said flash EEPROM cell. The negative gate erasing begins by floating said drain. Concurrently the ground reference potential is applied to the semiconductor substrate. Concurrently, a voltage potential in decreasing step wise increments from a ground reference potential to a first relatively large negative voltage level is applied to said control gate. Also, concurrently a voltage potential in increasing step wise increments from the ground reference potential to a moderately large positive voltage level is applied to said source.

The final step of the method of the second embodiment is source erasing said flash EEPROM cell. The source erasing begins by continuing to maintain the first relatively large negative voltage level to the control gate of said EEPROM cell. At this same time a moderately large positive voltage pulse is applied to said semiconductor substrate. During the source erasing the drain and source are floating.

The negative gate erasing the flash EEPROM removes charges from the floating gate, while the source erasing detraps the flash EEPROM to removes charges trapped in the tunneling oxide between the floating gate and the semiconductor substrate. The combination of the negative gate erasing followed by the source erasing of the EEPROM cell allows a separation of a programmed threshold voltage from an erased threshold voltage to be maintained over the repeated writing and erasing of said flash EEPROM, thus improving said write/erase threshold voltage closure.

The moderately large positive voltage level has a voltage range of from approximately 0.5V to approximately 5V, preferably 4.3V. The moderately large positive voltage level has a first initial voltage increment that ranges from approximately 1 mV to approximately 1.0V. The moderately large positive voltage level has a first plurality of subsequent voltage increments that ranges from approximately 1 mV to approximately 1.0V. The first initial voltage increment and the first plurality of subsequent voltage increments have a time duration that ranges from approximately 1 m second to approximately 10 seconds.

The relatively large negative voltage level has a voltage range of from approximately −5V to approximately −15V, preferably −10V. The relatively large negative voltage level has a second initial voltage increment that ranges from approximately −1 mV to approximately −1.0V. The relatively large negative voltage level has a second plurality of subsequent voltage increments that range from approximately −1 mV to approximately −1.0V. The second initial voltage increment and the second plurality of subsequent voltage increments have a time duration that ranges from approximately 1 m second to approximately 10 seconds.

The moderately large positive voltage pulse has a voltage level that is preferably 5.0V but has a voltage range of from approximately 0.5V to the voltage level that is approximately that of the power supply voltage source.

The duration of the negative gate erasing and the source erasing each range from approximately 10 m seconds to approximately 100 m seconds.

A third embodiment of a combination method to erase a flash EEPROM cell begins by source erasing said flash EEPROM cell. The source erasing begins by applying a voltage level in increasing step wise increments from the ground reference potential to apply a relatively large positive voltage level to the source of said EEPROM cell. Simultaneously a ground reference voltage is applied to the control gate and to the semiconductor substrate, while the drain is floating. The second step of the combination method to erase the flash EEPROM cell is channel erasing. Channel erasing begins by floating said source and drain. A moderately high positive voltage pulse is applied to said semiconductor substrate, while simultaneously applying a relatively large negative voltage pulse to said control gate.

The source erasing the flash EEPROM removes charges from the floating gate, while the channel erasing the flash EEPROM removes charges trapped in the tunnel oxide between the floating gate and the semiconductor substrate.

The source erasing followed by the negative gate erasing the flash EEPROM allows a separation of a programmed threshold voltage from an erased threshold voltage to be maintained over the repeated writing and erasing of said flash EEPROM, thus improving said write/erase threshold voltage closure.

The relatively high voltage has a voltage of from approximately 5.0V to approximately 10.0V. The moderately high voltage pulse has a voltage of from approximately 0.5V to approximately 5.0V. And the relatively large negative voltage pulse has a voltage of from approximately −5.0V to approximately 15.0V.

The relatively high voltage level, the moderately high voltage pulse, and the relatively large negative voltage pulse each have a duration of from approximately 10 m seconds to approximately 100 m seconds.

BRIEF DESCRIPTION OF THE DRAWINGS

FIGS. 1a and 1b are a cross-sectional views of alternative structures of a lash EEPROM cell of the prior art.

FIGS. 2a and 2b are timing diagrams of a negative gate erase cycle of the flash EEPROM of the prior art.

FIG. 2c is a plot of the threshold voltages versus the number of programming and erasing cycles, using the erasing cycle of the prior art, as shown in FIG. 2a.

FIG. 3a are timing diagrams of a source erase cycle of the flash EEPROM of the prior art.

FIG. 3b is a plot of the threshold voltages versus the number of programming and erasing cycles, using the erasing cycle of the prior art, as shown in FIG. 3a.

FIG. 4a is a timing diagram of a channel erase cycle of the flash EEPROM of the prior art.

FIG. 4b is a plot of the threshold voltages versus the number of programming and erasing cycles, using the erasing cycle of the prior art, as shown in FIG. 4a.

FIG. 5 is a timing diagram of an erase cycle of the flash EEPROM of the prior art.

FIG. 6a is a timing diagram of a combination erase cycle of the flash EEPROM of the prior art.

FIG. 6b is a plot of the threshold voltages versus the number of programming and erasing cycles, using the combination erasing cycle of the prior art, as shown in FIG. 6a.

FIG. 7a is a timing diagram of a second combination erase cycle of the flash EEPROM of the prior art.

FIG. 7b is a plot of the threshold voltages versus the number of programming and erasing cycles, using the combination erasing cycle of the prior art, as shown in FIG. 7a.

FIG. 9b is a plot of the threshold voltages versus the number of programming and erasing cycles using the erase cycle of this invention as shown in FIG. 6a.

FIG. 10c is a plot of the threshold voltages versus the number of programming and erasing cycles using the erase cycle of this invention as shown in FIG. 10a.

DETAILED DESCRIPTION OF THE INVENTION

Figure 8A:
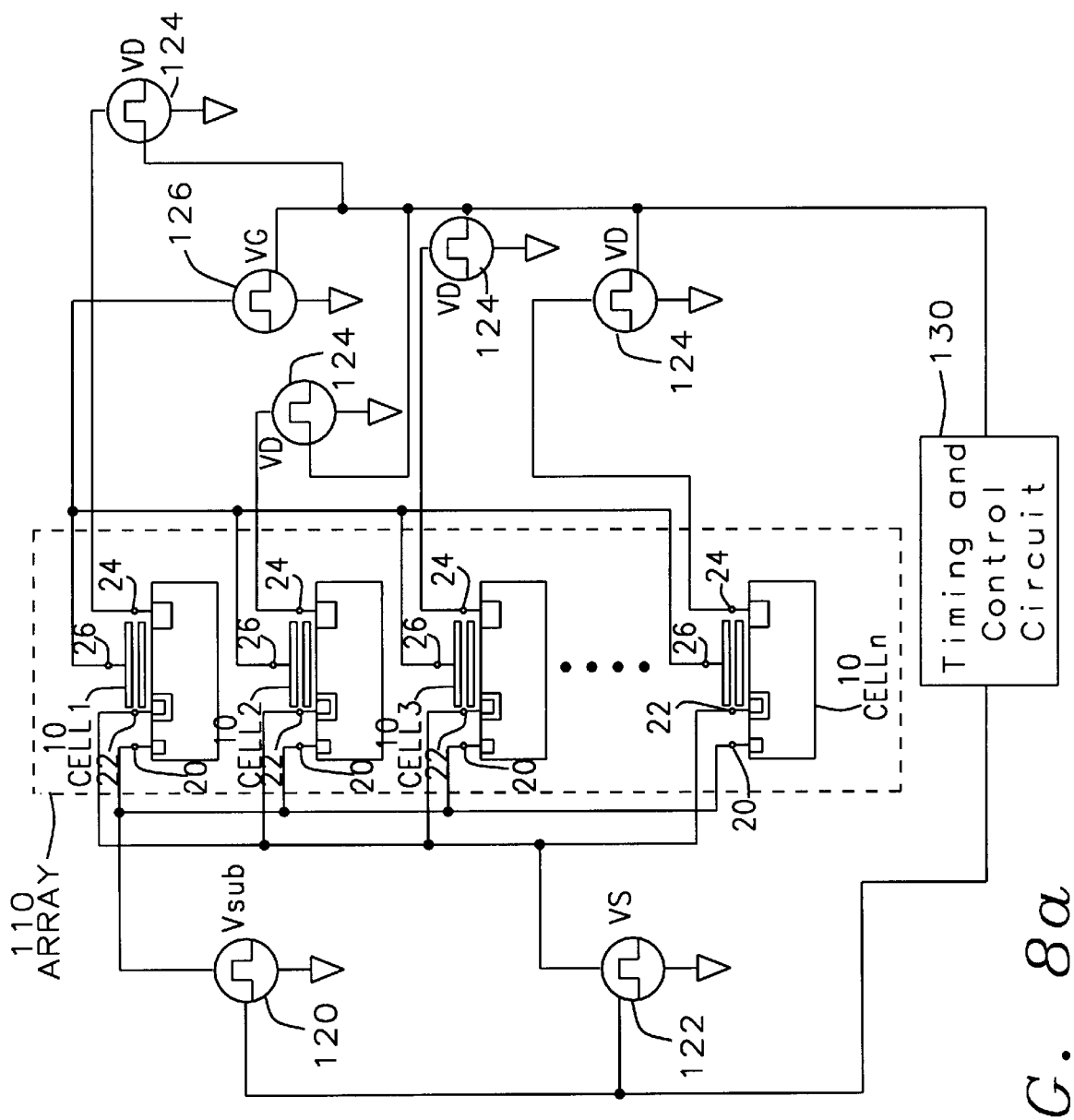
FIGS. 8a and 8b are diagrams of an arrays of the alternative structures of flash EEPROM cells showing the connections of the voltage generators of this invention.
Figure 8B:
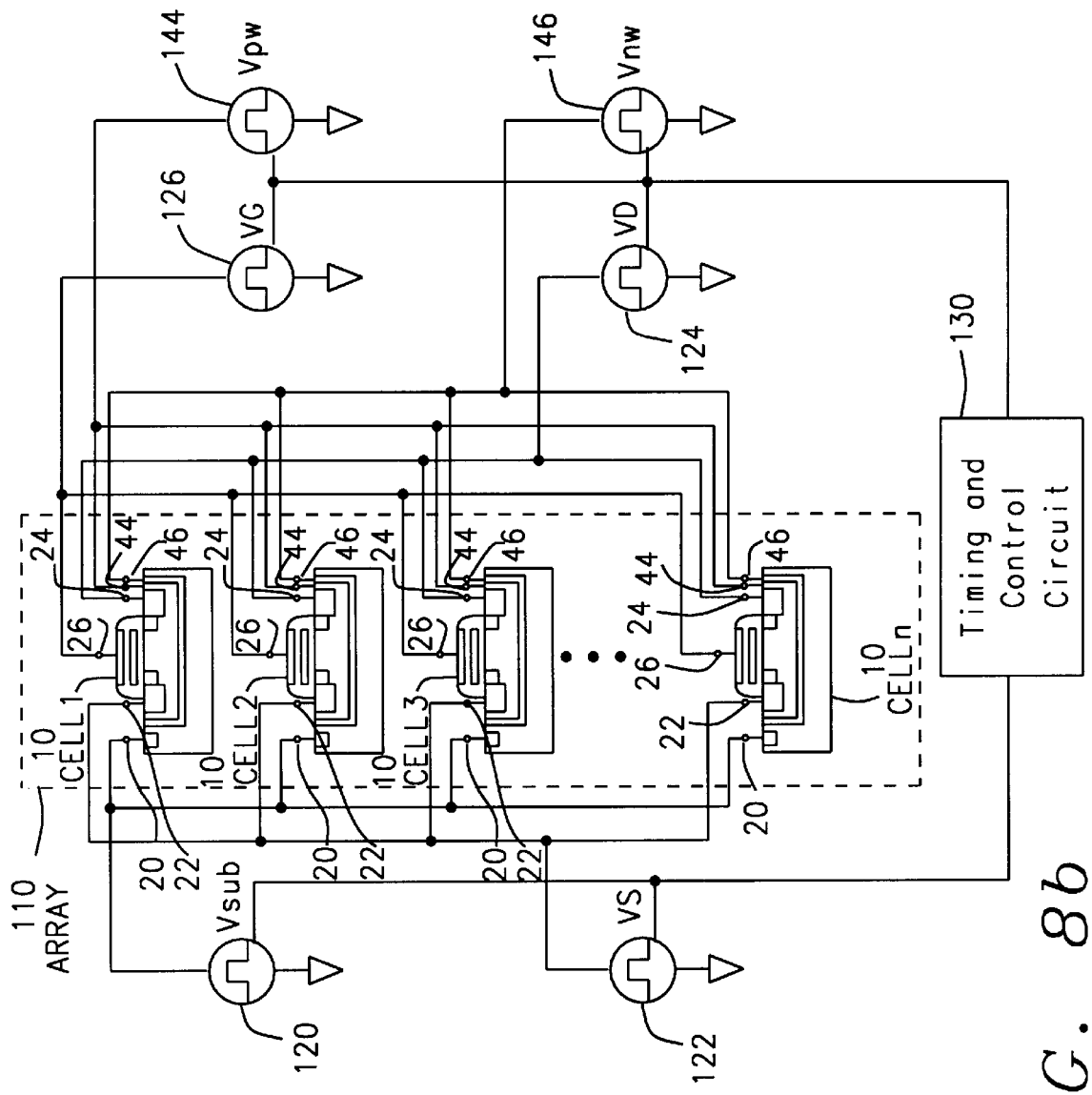

Referring now to FIGS. 8a and 8b, an array 110 of flash EEPROM cells 10 is disposed upon a common substrate. For convenience of design, the cells Cell1, Cell2, Cell3, . . . , Celln will be formed into rows and column. The array will have auxiliary circuitry (not shown) that will address either the individual cells Cell1, Cell2, Cell3, . . . , Celln or groups of cells for reading from the cells or for writing or programming the cells. The writing or programming procedures will as described for the flash EEPROM cell of FIG. 1a for FIG. 8a and FIG. 1b for FIG. 8b.

The connection for the substrate voltage generator VSub 120 will be connected through the terminal 20 to the P-type substrate. The connection of the source voltage generator VS 122 to the source region is through the terminal 22. The connection of the drain voltage generator VD 124 to the drain region is through terminal 24. The connection of the gate control voltage generator VG 126 to the control gate is through the terminal 26. In FIG. 8b, the p-well voltage generator VPw 144 and the n-well voltage generator VNw 146 will be connected respectively to the p-well 45 and the n-well 47 through terminals 44 and 46. The timing and control circuitry 130 in conjunction with the auxiliary circuitry (not shown) will determine the voltages and timings for the substrate voltage generator VSub 120, the source voltage generator VS 122, the drain voltage generator VD 124, the gate control voltage generator VG 126 the p-well voltage generator VPw 144 of FIG. 8b, and the n-well voltage generator VNw 146 of FIG. 8b.

Figure 9A:
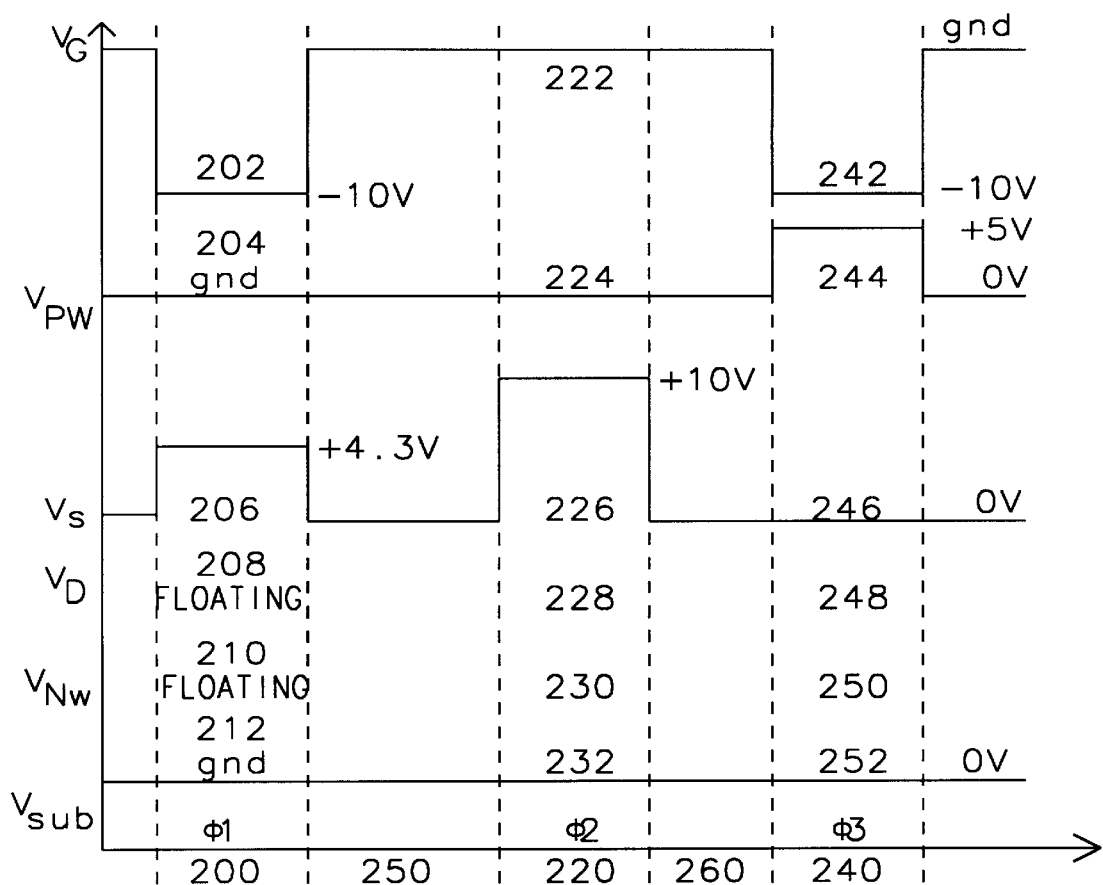
FIG. 9a is timing diagram of a combination erase cycle of a flash EEPROM of this invention.

Refer now to FIGS. 1b, 8b, and 9a to understand a first embodiment of a combination erase cycle of this invention. The initial period of the multiple phase erase cycle or negative gate erase cycle (phase 1) 200 begins by setting 202 the control gate voltage generator VG 126 and thus the control gate 28 to a first relatively negative voltage of approximately −10.0V. The range of voltage for the first relatively large negative voltage is from approximately −5.0V to approximately −15.0V. Concurrently, the source voltage generator Vs 122 and thus the source region 16 are set 206 to a first moderately positive voltage of approximately +4.3V. The first moderately positive voltage has a range of from approximately +0.5V to approximately +5.0V. At this same time, the P-well voltage generator VPw 144 and thus the P-well 45 and the substrate voltage generator VSub 120 and thus the semiconductor substrate 12 are set 204 and 212 to the ground reference potential. The drain voltage generator VD 124 and the N-well voltage generator VNw 146 are disconnected respectively from the drain region 14 and the N-well 47 to allow the drain region 14 and the N-well 47 to float.

Having terminated the negative gate erase cycle 200 (phase 1), the source erase cycle (phase 2) 220 of the multiple phase erase cycle can begin. The control gate voltage generator VG 126 is brought the ground reference potential to set the control gate 28 to the ground reference potential. Concurrently, the source voltage generator VS 122 is set to a relatively large positive voltage 10.0V) to bring the source region 16 to the relatively large positive voltage 226. At this time, the substrate voltage generator VSub 120 and thus the P-type substrate 12 and the P-well voltage generator 144 and thus the P-well 45 will remain at the ground reference potential (0V) 224 and 232. While the drain voltage generator VD 124 will remain disconnected from the drain region 14 thus maintaining the drain region 14 at a floating condition 228, and the n-well voltage generator VNw 146 will remain disconnected from the n-well 47 to keep the n-well 47 floating 230.

The voltage biases as described for the negative gate erase cycle (phase 1) 200 and the source erase cycle (phase 2) 220 create the electric field 66 within the tunneling oxide 36. The electrons 31 trapped on the floating gate 32 are extracted and forced into the source due to the Fowler-Nordheim tunneling above described.

The third phase or channel erase phase (phase 3) 240 starts by setting the gate control voltage generator VG 126 and thus the control gate to a second relatively large negative voltage (−10V) 242. The range of the second relatively large negative voltage is from approximately −5.0V to approximately −15.0V. The source voltage generator VS 122 and thus the source region 16 is connected 246 to the ground reference potential. The p-well voltage generator VPw 144 and thus the p-well 45 will be set to a second moderately high positive voltage (+5.0V) 244. The range of the second moderately high positive voltage is from approximately +0.5V to approximately +5.0V. The n-well voltage generator VNw 146 will be disconnected from the n-well 47 to allow the n-well 47 to be floating 250. The drain voltage generator VD 124 will be disconnected from the drain region 14 to be floating 248. The substrate voltage generator VSub 120 and thus the P-type substrate 12 will be set to the ground reference potential (0V) 252. The voltages as described and shown in the channel erase phase (phase 3) 240 will force the trapped charges 38 and 42 in the tunneling oxide 36 and the interface traps 40 of the flash EEPROM cell 10 will be forced by the electric field 66 to be removed to the P-well 45.

The periods 250 and 260 between the negative gate erase phase (phase 1) 200 and the source erase phase (phase 2) 220 and between the source erase phase (phase 2) 220 and the channel erase phase (phase 3) 240 act as a transition interval to respectively terminate the negative gate erase phase (phase 1) 200 and the source erase phase (phase 2) 220.

The transition intervals 250 and 260 each begin by bringing the source voltage generator VS 122, the p-well voltage generator VPw 144 and the gate control voltage generator VG 126 to the ground reference potential (0V). The substrate voltage generator VSub 120 will remain at the ground reference potential (0V). The drain voltage generator VD 124 will remain disconnected from the drain region 24 to keep the drain region 24 floating, and the n-well voltage generator VNw 146 will remain disconnected from the n-well 47 to keep the n-well 47 floating. The transition intervals 250 and 260 each have a time duration of from 0 to 2 m seconds.

The electric field 66 within tunneling oxide 36 must be in the saturation region. The field is dependent upon the voltage of the gate control voltage generator VG 126, the p-well voltage generator VPw 144 and the number of trapped electrons 40 in the tunneling oxide 36 and in the surface states 42. Thus, the voltage $V_{TU}$ across the tunneling oxide field becomes:

$$V_{TU} = \varepsilon_{TU} d_{ox} = K_{C1}VG + K_{C2}Vs + \frac{Q_{trap}}{C_{ox}} + K_{C3}Vpw$$

Where:
   $Q_{trap}$ is the charge of the electrons trapped in the floating gate 32.
   $K_{C1}$ is the coupling ratio of the control gate 28.
   $K_{C2}$ is the coupling ratio of the source 16.
   $K_{C3}$ is the coupling ratio of the P-well 45.
   $\varepsilon_{TU}$ is the electrical field 66 present within the tunneling oxide 36.
   $d_{ox}$ is the thickness of the tunneling oxide 36.
   $C_{ox}$ is the capacitance between the floating gate 32 and the P-well 45

The magnitude applied voltages of the gate control voltage generator VG, and the P-well voltage generator VPw will be dependent on the thickness of the tunneling oxide 36 and the interpoly dielectric 30, which will vary with the technology parameters.

As can be seen from the above equation, the negative gate erase phase (phase 1) 200 and the source erase phase (phase 2) 220 will operate at high field due to the number of electrons available in the floating gate 32. Though the electrons 40 and 42 trapped in the tunneling oxide 36 can be detrapped the negative gate erase phase (phase 1) 200 and the source erase phase (phase 2) 220, a certain number of trapped centers will be generated due to the high field and high current that passes through the tunneling oxide 36.

However, if the duration of the negative gate erase phase (phase 1) 200 and the source erase phase (phase 2) 220 is shortened compared to the prior art, the degradation can be minimized.

The channel erase phase (phase 3) 240 will now operate at a relatively low field, since some of the electrons have been removed during the negative gate erase phase (phase 1) 200 and the source erase phase (phase 2) 220. This will prevent any generation of the positive charges or "hot holes" as described in FIG. 1 to be trapped in the tunneling oxide 36. These positive charges or "hot holes" will cause the degradation of the threshold voltage $V_T$ as shown in FIGS. 2b, 3b, and 4b. Since there will be no generation of the positive charges or "hot holes", there will be no degradation of the threshold voltage $V_T$ using the multiple mode erasing cycle of this invention over time as shown in FIG. 5b.

The relative period of time for the negative gate erase phase (phase 1) 200, the source erase phase (phase 2) 220, and channel erase phase (phase 3) 240 of the multiple phase erase cycle is from approximately 10 m sec to 2 sec. in duration.

Figure 9B:
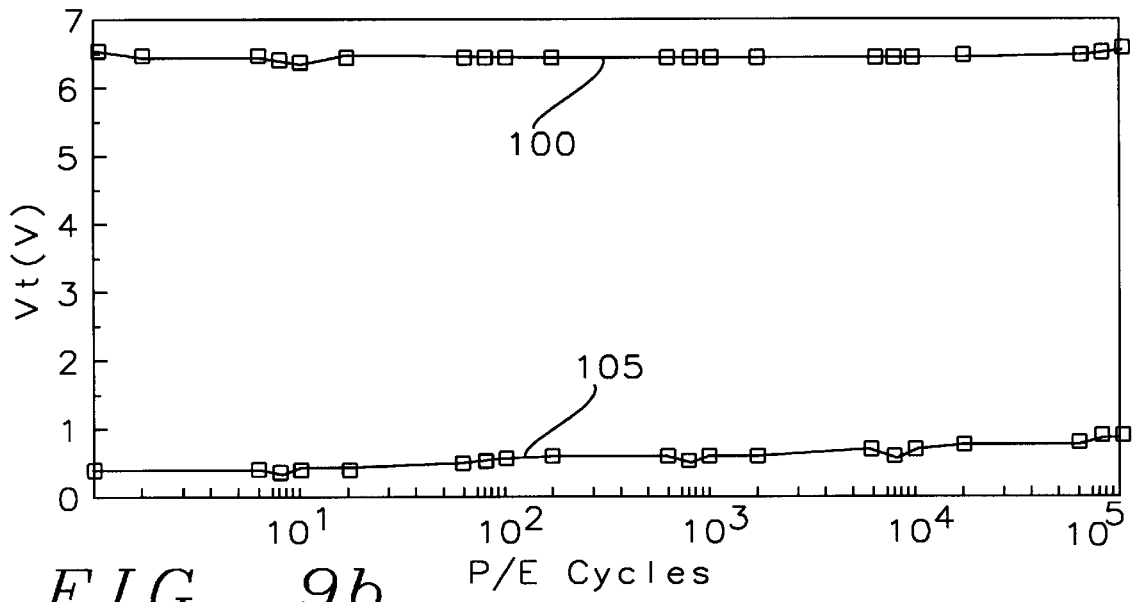
Figure 9C:
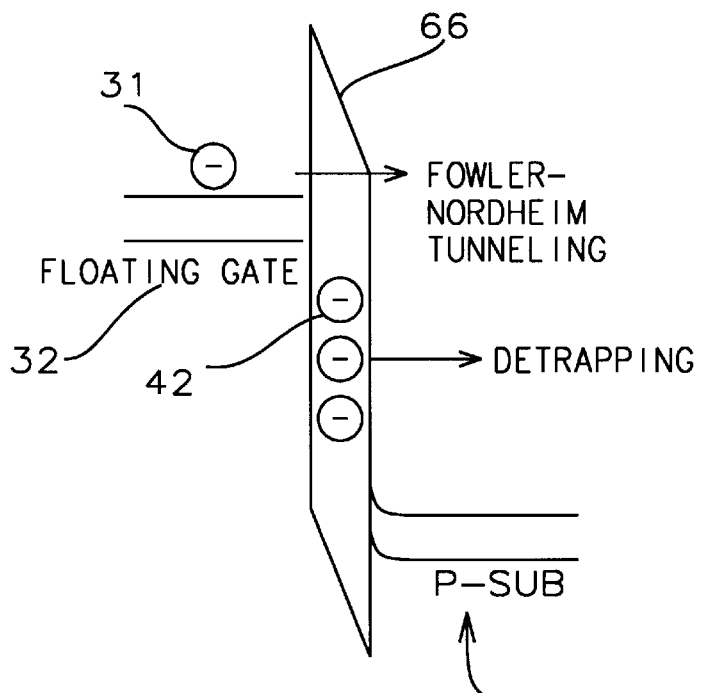
FIG. 9c is an energy band diagram of a flash EEPROM cell showing the removal of charges during an erasing cycle of this invention.

Refer now to FIGS. 1b and 9c for a description of the physical basis for the detrapping phase of the erase cycle of the flash EEPROM of this invention. As above described, during the channel erase phase (phase 3) 240, the gate control voltage generator VG is set to the second relatively large negative voltage (−10V). Since the gate control voltage generator VG 126 is connected through the terminal 26 to the control gate 28, the control gate 28 will be set to the second relatively large negative voltage (−10V). The drain region 14 and the n-well 47 is disconnected from their respective voltage generators and allowed to be floating. The voltage of the substrate voltage generator Vsub 120 and the source voltage generator VS 122 are set to the ground reference potential (0V), which is respectively connected through terminal 20 to the P-type substrate 12 and terminal 22 to the source region 16. The P-well voltage generator VPw and thus the source will be set to the second moderately large voltage (5V).

The voltages as described will set up an electric field 66 in the gate dielectric or tunneling oxide 36. Those electrons 42 trapped in the tunneling oxide 36 will be forced to be dissipated in the P-well, while there will be no positive charges or "hot holes" generated at during the source erase cycle. Thus eliminating any residual charges from the floating gate 32 or trapped charges 42 from the tunneling oxide 36.

This process will insure that the erased threshold voltage for the flash EEPROM cell 10 will return to the low threshold voltage of a completely erased cell. The elimination of the trapped charges 42 will also allow the appropriate increase of the programmed threshold voltage to the high threshold voltage approximately (6V) of a programmed cell.

As is shown in FIG. 9b, the programmed threshold voltage 100 will remain at a relatively constant value of approximately 6V (changing by less than 0.5V) for at least 100,000 programming/erase cycles. Also, as can be seen, the erased threshold voltage 105 will remain at a constant value of approximately 0.5V for the 100,000 programming/erase cycles. By not degrading the threshold as seen in FIGS. 2b, 3b, and 4b, the flash EEPROM cell 10 of FIG. 1b and the flash EEPROM array 110 of FIG. 8b will maintain operation without failure for programming/erase cycle in excess of 100,000 cycles.

Figure 10A:
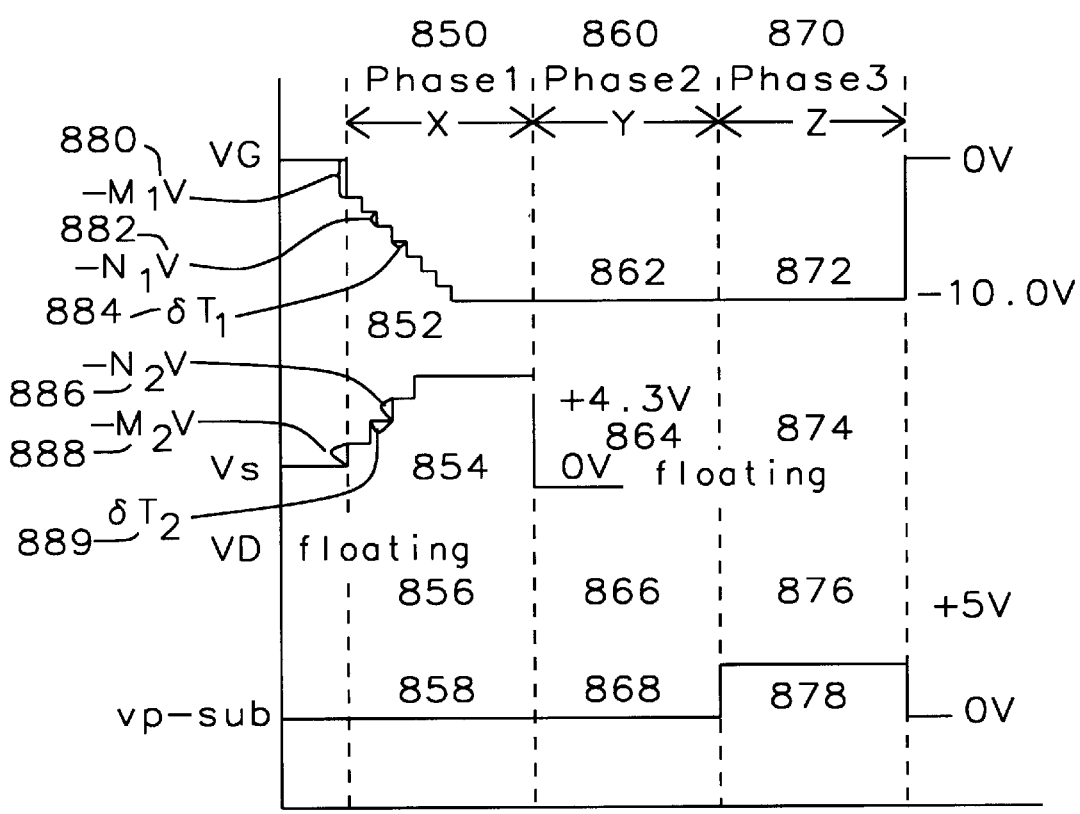
FIG. 10a is timing diagram of a second embodiment of a combination erase cycle of a flash EEPROM of this invention.

Refer now to FIGS. 1a, 8a, and 10a to understand the second embodiment of the combination erase cycle of this invention. The initial period of the erase cycle (phase 1) or negative gate erase phase 850 starts by the gate control voltage generator VG 126 is lowered in a step wise increments from the ground reference potential (0V) to a relatively large negative voltage level (–10V) 852. Concurrently, the source voltage generator VS 122 is increased in step wise increments from the ground reference potential (0V) to a moderately large voltage level (4.3V) to bring the source region 16 to the moderately large voltage level (4.3V) 854. At this time, the substrate voltage generator Vsub 120 and thus the p-type substrate 12 will be set at the ground reference potential (0V) 858. While the drain, voltage generator VD 124 will be disconnected from the drain region 14 to maintain the drain region 14 at a floating condition 856.

A second phase (phase 2) 860 will terminate the negative gate erase phase 850 by bringing the source voltage generator VS 122 to the ground reference potential (0V) 864. The gate control voltage generator VG 126 remains at the relatively large negative voltage (–10V). The substrate voltage generator Vsub 120 will remain at the ground reference potential (0V) 868. The drain voltage generator VD 124 will remain disconnected from the drain region 24 to keep the drain region 24 floating 866.

Having terminated the negative gate erase phase 850 in phase 2 860, the source erase phase (phase 3) 870 can begin by setting the substrate voltage generator Vsub 120 and thus the p-type substrate 12 to a moderately high voltage level (5V) 878. The gate control voltage generator VG 126 and thus the control gate remains at the first relatively large negative voltage (–10V) 872. The source voltage generator VS 122 will be disconnected from the source region 16 to allow the source region 16 to be floating 874. The drain voltage generator VD 124 will also remain disconnected from the drain region 14 such that it will remain floating 876.

The voltages as described for the source erase phase and shown in FIG. 1*b* will force the trapped charges on the floating gate 30 of the flash EEPROM cell 10 to migrate to the end of the floating gate 30 immediately above the source region 16. The electric field in the tunneling oxide 36 will force these trapped electrons to flow through the tunneling oxide 36 by the Fowler-Nordheim tunneling into the source region 16. At the completion of the phase 3 870 there will be positive charges 38 remaining in the tunneling oxide 36 as described above. Additionally there will be electrons 42 that have been trapped in the tunneling oxide 36 and at the surface states 40, again as described above.

During the negative gate erase phase (phase 1) 850, the relatively large negative voltage (–10V) present at the control gate can range in magnitude from –5.0V to –15.0V. The moderately large positive voltage (+4.3V) present at the source at this time can range from 0.5V to the value of the power supply voltage source generally 5.0V. During the source erase phase (phase 3), the relatively large negative voltage (–10V) can again have a range of from –5.0V to –15.0V and the moderately high voltage level (+5V) created by the substrate voltage generator Vsub that is present at the semiconductor substrate can have a range of +0.5V to that of the power supply voltage source generally +5.0V.

The relative period of time for the phase 1 850, phase 2 860 and phase 3 870 of the erase cycle is approximately 50 msec. in duration. These cycles can range up to 1 Sec. in length.

The initial voltage increment 880 for the step wise increment of the gate control voltage generator VG 126 ranges from approximately –1.0 mV to approximately –1.0V and is preferably –10.0 mV. Each subsequent voltage increment 882 for the step wise increment of the gate control voltage generator VG 126 ranges from approximately –1.0 mV to approximately –1.0V and is preferably 10.0 mV. The amount of time 884 for the step wise increment of the gate control voltage generator VG 126 ranges from approximately 1.0 m second to approximately 10.0 seconds, and is preferably 10.0 m seconds.

The initial voltage increment 887 for the step wise increment of the source voltage generator VS 122 ranges from approximately 0.5V to approximately 5.0V and is preferably 4.3V. Each subsequent voltage increment 885 for the step wise increment of the source voltage generator VS 122 ranges from approximately 1.0 mV to approximately 1.0V and is preferably 10.0V. The amount of time 884 for the step wise increment of the source voltage generator VS 122 ranges from approximately 1 m second to approximately 10.0 seconds, and is preferably 10.0 m seconds.

Refer now to FIG. 1*a* for a description of the physical basis for the negative gate erase phase of the erase cycle of the flash EEPROM of this invention. As above described, during the negative gate erase phase (phase 1) 850, the gate control voltage generator VG lowered in a step wise increments from the ground reference potential (0V) to the relatively large negative voltage level (–10V). Since the gate control voltage generator VG is connected through the terminal 26 to the control gate 28, the control gate 28 is set to the relatively large negative voltage level (–10V). The drain 14 is disconnected from their respective voltage generators and allowed to be floating. The voltage of the substrate voltage generator Vsub is set to the ground reference potential (0V), which will be respectively connected through terminal 20 to the p-type substrate 12. The source voltage generator VS and thus the source is increased in step wise increments from the ground reference potential (0V) to the moderately large voltage level (4.3V).

As described above, the initial voltage increment 880 for the step wise increment of the gate control voltage generator VG 126 ranges from approximately –1.0 mV to approximately –1.0V and is preferably –10.0 mV. Each subsequent voltage increment 882 for the step wise increment of the gate control voltage generator VG 126 ranges from approximately –10 mV to approximately –1.0V and is preferably 10.0 mV. The amount of time 884 for the step wise increment of the gate control voltage generator VG 126 ranges from approximately 1.0 m second to approximately 10.0 seconds, and is preferably 10.0 m seconds.

Also as described above, the initial voltage increment 887 for the step wise increment of the source voltage generator VS 122 ranges from approximately 0.5 V to approximately 5.0V and is preferably 4.3V. Each subsequent voltage increment 885 for the step wise increment of the source voltage generator VS 122 ranges from approximately 1.0 mV to approximately 1.0V and is preferably 10.0V. The amount of time 884 for the step wise increment of the source voltage generator VS 122 ranges from approximately 1 m second to approximately 10.0 seconds, and is preferably 10.0 m seconds.

The voltages as described will set up an electric field in the gate dielectric or tunneling oxide 36. Those electrons 42 trapped in the tunneling oxide 36 will be forced to be dissipated in the p-type substrate while the positive charges 38 will be attracted to the floating gate 32 thus eliminating any residual charges from the floating gate 32 or trapped charges 42 from the tunneling oxide 36.

This process will insure that the erased threshold voltage for the flash EEPROM cell 10 will return to the low threshold voltage of a completely erased cell. The elimination of the trapped charges 42 will also allow the appropriate increase of the programmed threshold voltage to the high threshold voltage approximately (6V) of a programmed cell.

Figure 10B:
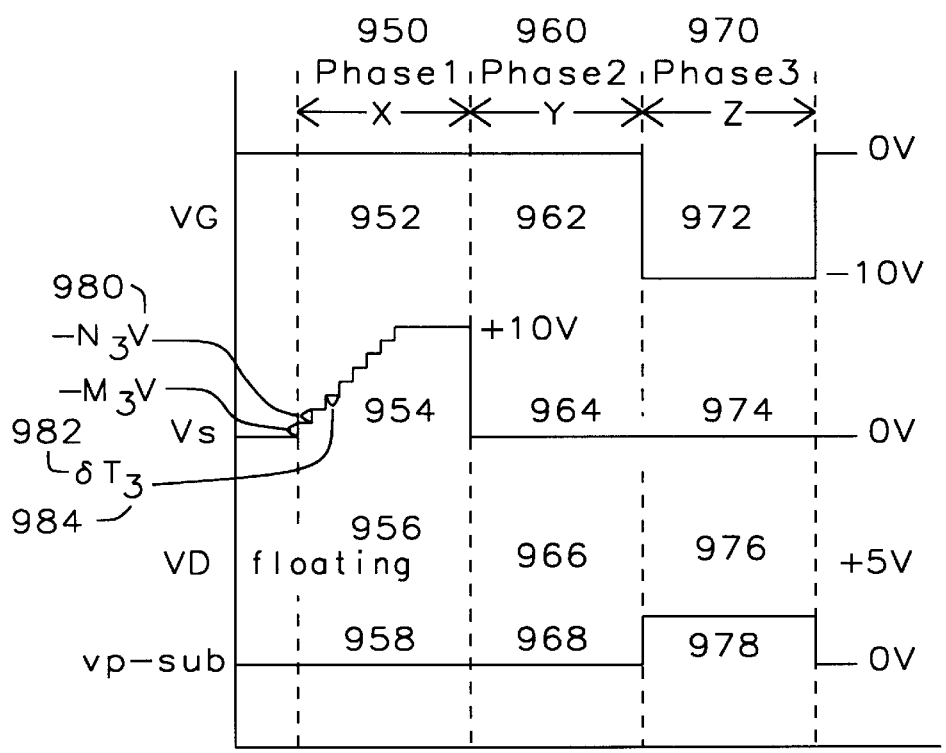
FIG. 10b is timing diagram of a third embodiment of a combination erase cycle of a flash EEPROM of this invention.
Figure 10C:
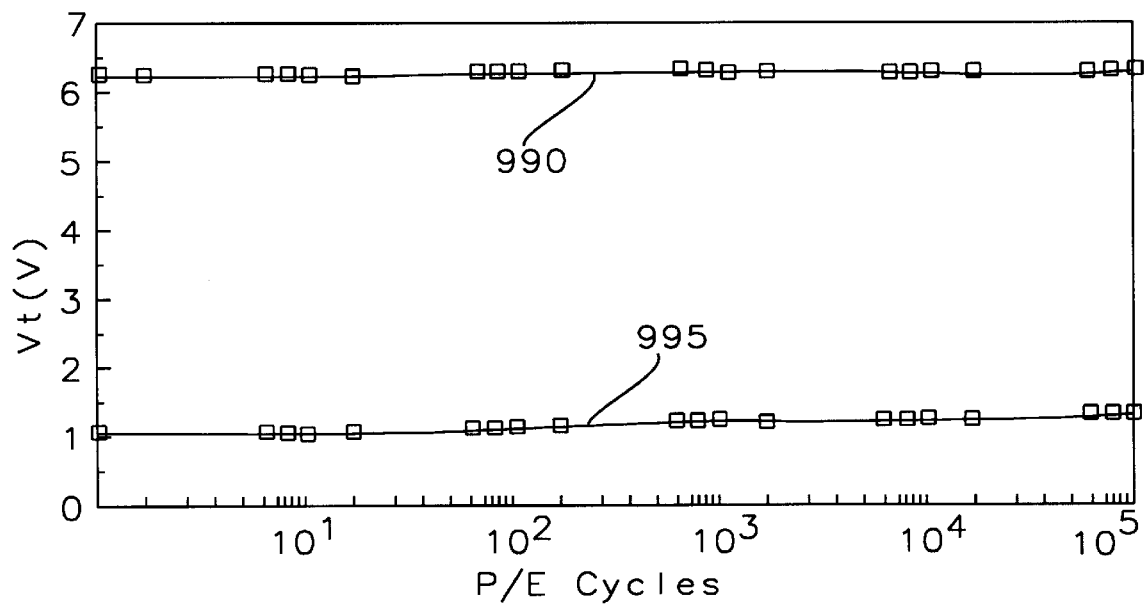

As is shown in FIG. 10c, the programmed threshold voltage 890 will remain at a relatively constant value of greater than 6V for at least 1000,000 programming/erase cycles. Also, as can be seen, the erased threshold voltage 895 will remain at a constant value of somewhat more than 1.0V and degrading by less than 0.5V for the 100,000 programming/erase cycles. By not degrading the threshold to the degree as seen in FIG. 7b, the flash EEPROM cell 10 of FIG. 1a and the flash EEPROM array 110 of FIG. 8a will maintain operation with out failure for programming/erase cycle in excess of 100,000 cycles.

Refer now to FIGS. 1a, 8a, and 10b to understand the third embodiment of the combination erase cycle of this invention. The initial period of the erase cycle (phase 1) or source erase 950 starts by setting the gate control voltage generator VG 126 and thus the control gate to the ground reference potential (0V) 952. The source voltage generator VS 122 and consequently the source region 18 is increased in step wise increments from the ground reference potential (0V) to a relatively high voltage level (approximately 10V) 954. The substrate voltage generator Vsub 120 and thus the p-type substrate 12 will be set to the ground reference potential (0V) 956. The drain voltage generator VD 124 will be disconnected from the drain region 14 to be floating 958. The voltages as described will force the trapped charges on the floating gate 30 of the flash EEPROM cell 10 to migrate to the end of the floating gate 30 immediately above the source region 18. The electric field in the tunnel oxide 36 will force these trapped electrons to flow through the tunnel oxide 36 by the Fowler-Nordheim tunneling into the source region 18. At the completion of the source erase (phase 1) 950 there will be positive charges 38 remaining in the tunnel oxide 36 as described above. Additionally there will be electrons 42 that have been trapped in the tunnel oxide 36 and at the surface states 40, again as described above.

A second phase (phase 2) 960 will terminate the source erase by bringing the source voltage generator VS 122 to the ground reference potential (0V). The gate control voltage generator VG 126 and the substrate voltage generator Vsub 120 will remain at the ground reference potential (0V) 962 and 966. The drain voltage generator VD 124 will remain disconnected from the drain region 24 to keep the drain region 24 floating 968.

Having terminated the source erase cycle 950 in phase 2 960, the channel erase phase (phase 3) can begin. The gate control voltage generator VG 126 is brought to a relatively large negative voltage level (−10V) 972. The source voltage generator VS 122 remains at the ground reference potential (0V) 974. Concurrently, the substrate voltage generator Vsub 120 and thus the p-type substrate 12 will be brought to a moderately high positive voltage level (+5V) 976. At this time the drain voltage generator VD 124 will remain disconnected from the drain region 14 thus maintaining the drain region 14 at a floating condition 978.

The range of the source voltage generator VS 122 will be from 5.0V to 15V. The range of the gate control voltage generator VG 126 is from −5.0V to 15.0, and the range of the substrate voltage generator Vsub 120 is from 0.5V to the value of the power supply voltage source or about 5.0V.

The relative period of time for the phase 1 950, of the source erase is 50 msec. in duration but can range from 10 msec. to 100 msec. Phase 2 960 and Phase 3 970 are approximately 30 and 50 msec. in duration respectively. The range in duration of phase 3 970 is from 10 msec. to 100 msec. Additionally the phase 3 970 would normally be practiced at every source erase. However, the phase 3 970 could be practiced periodically to eliminate trapped charges.

The initial voltage increment 982 for the step wise increment of the source voltage generator VS 122 ranges from approximately 5.0V to approximately 15.0V and is preferably 10.0V. Each subsequent voltage increment 980 for the step wise increment of the source voltage generator VS 122 ranges from approximately 1.0 mV to approximately 1.0V and is preferably 10.0 mV. The amount of time 984 for the step wise increment of the source voltage generator VS 122 ranges from approximately 1 m second to approximately 10.0 seconds, and is preferably 10.0 m seconds.

Refer now to FIG. 1a for a description of the physical basis for the channel erase phase of the source erase of the flash EEPROM of this invention. As above described, during the channel phase (phase 3), the gate control voltage generator VG is set to a relatively large negative voltage level (−10V). Since the gate control voltage generator VG is connected through the terminal 26 to the control gate 28, the control gate 28 will be set to the relatively large negative voltage level (−10V). The source region 18 and the drain 14 will be disconnected from their respective voltage generators and allowed to be floating 60. The voltage of the substrate voltage generator Vsub will be set to the moderately high positive voltage (5V), which will be connected through terminal 20 of FIG. 8b to the p-type substrate 12.

The voltage as described will set up an electric field 66 in the gate dielectric or tunnel oxide 36. Those electrons 64 trapped in the tunnel oxide 36 will be forced to be dissipated in the p-type substrate while the positive charges 62 will be attracted to the floating gate 32 thus eliminating any residual charges from the floating gate 32 or trapped charges from the tunnel oxide 36.

This process will insure that the erased threshold voltage for the flash EEPROM cell 10 will return to the low threshold voltage of a completely erased cell. The elimination of the trapped charges 64 will also allow the appropriate increase of the programmed threshold voltage to the high threshold voltage approximately (6V) of a programmed cell.

As is shown in FIG. 10c, the programmed threshold voltage 990 will remain at a relatively constant value of approximately 6V for at least 100,000 program/erase cycles. Also, as can be seen, the erased threshold voltage 995 will remain at a constant value of approximately 0.5V for the 100,000 program/erase cycles. By not degrading the threshold to the degree as seen in FIG. 6b, the flash EEPROM cell 10 of FIG. 8a and the flash EEPROM array 110 of FIG. 8a will maintain operation without failure for program/erase cycle in excess of 100,000 cycles.

The second and third embodiments of this invention have been described relative to FIGS. 1a and 8a. That is the substrate voltage generator Vsub 20 is pulsed during the erasure procedure. It would be obvious to one skilled in the art, from the descriptions of the second and third embodiments, that the methods of erasure of the second and third embodiment could be applied to EEPROM cells and arrays of FIGS. 1b and 8b. The p-well voltage generator Vpw 44 is now pulsed. while the substrate voltage generator Vsub 20 is set to the ground reference potential (0V). The n-well voltage generator Vnw 46 is disconnected from the n-well diffusion 47. The effects and operation of the EEPROM cell of FIG. 1b would be equivalent to that of FIG. 1a.

While this invention has been particularly shown and described with reference to the preferred embodiments thereof, it mill be understood by those skilled in the art that various changes in form and details may be made without departing from the spirit and scope of the invention.

The invention is claimed is:

1. A method to erase a flash EEPROM cell, which is comprised of a source and a drain diffused into a semiconductor substrate of the first conductivity type, and a control gate, a floating gate, and a tunneling oxide disposed upon the semiconductor substrate, to improve a write/erase threshold voltage closure from repeatedly writing and erasing said flash EEPROM cell, comprising the steps of:

negative gate erasing to detrap said flash EEPROM cell by the steps of: floating said drain,
concurrently applying the ground reference potential to said semiconductor substrate,
concurrently applying a first voltage in decreasing step wise increments from a ground reference potential to a first relatively large negative voltage level to said control gate, and
concurrently applying a second voltage in increasing step wise increments from the ground reference potential to a moderately large positive voltage level to said source; and source erasing said flash EEPROM cell by the steps of,
continuing to maintain the first relatively large negative voltage level to the control gate of said EEPROM cell,
concurrently applying a moderately large positive voltage pulse to said semiconductor substrate, and
concurrently floating said drain and said source.

2. The method to erase a flash EEPROM cell of claim 1 wherein negative gate erasing the flash EEPROM removes charges from the floating gate.

3. The method to erase a flash EEPROM cell of claim 1 wherein source erasing detraps the flash EEPROM to removes charges trapped in the tunneling oxide between the floating gate and the semiconductor substrate.

4. The method to erase a flash EEPROM cell of claim 1 wherein negative gate erasing followed by source erasing of the flash EEPROM allows a separation of a programmed threshold voltage from an erased threshold voltage to be maintained over the repeated writing and erasing of said flash EEPROM, thus improving said write/erase threshold voltage closure.

5. The method to erase a flash EEPROM cell of claim 1 wherein the moderately large positive voltage level has a voltage range of from approximately 0.5V to a voltage level of a power supply voltage source.

6. The method to erase a flash EEPROM cell of claim 1 wherein the moderately large positive voltage level has a first initial voltage increment that ranges from approximately 1.0 mV to approximately 1.0V.

7. The method to erase a flash EEPROM cell of claim 6 wherein the moderately large positive voltage level has a first plurality of subsequent voltage increments that ranges from approximately 1.0 mV to approximately 1.0V.

8. The method to erase a flash EEPROM cell of claim 7 wherein the first initial voltage increment and the first plurality of subsequent voltage increments have a time duration that ranges from approximately 1.0 m second to approximately 10 seconds.

9. The method to erase a flash EEPROM cell of claim 1 wherein the relatively large negative voltage level has a voltage range of from approximately −5.0V to approximately −15.0V.

10. The method to erase a flash EEPROM cell of claim 1 wherein the relatively large negative voltage level has a second initial voltage increment that ranges from approximately 1.0 mV to approximately 1.0V.

11. The method to erase a flash EEPROM cell of claim 10 wherein relatively large negative voltage level has a second plurality of subsequent voltage increments that ranges from approximately 1.0 mV to approximately 1.0V.

12. The method to erase a flash EEPROM cell of claim 11 wherein the second initial voltage increment and the second plurality of subsequent voltage increments have a time duration that ranges from approximately 1.0 m second to approximately 10 seconds.

13. The method to erase a flash EEPROM cell of claim 1 wherein the moderately large positive voltage pulse has a voltage range of from approximately 0.5V to approximately 5.0V.

14. The method to erase a flash EEPROM cell of claim 1 wherein the negative gate erasing and the source erasing each have a duration that ranges from approximately 5 m seconds to approximately 1 second.

15. A non-volatile semiconductor memory device comprising:

a semiconductor substrate of a first conductivity type;
a pair of diffusions of a second conductivity type spaced distally from one another to form a source region and a drain region within said semiconductor substrate;
a tunneling oxide insulation disposed upon said semiconductor substrate in a region generally between the source region and drain region in correspondence with a negative gate region and having a thickness which allows tunneling of carriers there through;
a floating gate electrode disposed upon said tunneling oxide insulation generally in correspondence with said negative gate region;
an inter-poly dielectric insulation disposed upon said floating gate electrode to insulate said floating gate;
a control gate electrode disposed upon said inter-poly dielectric insulation generally aligned with said floating gate; and
an erasing means connected to said source region, drain region, control gate electrode, and semiconductor substrate to remove electrical charges from said floating gate electrode and to detrap trapped electrical charges from said tunneling oxide insulation to improve a separation factor of a programmed threshold voltage and an erased threshold voltage of said non-volatile semiconductor memory device by the steps of:
negative gate erasing to detrap said tunneling oxide insulation by the steps of:
floating said drain region,
concurrently applying the ground reference potential to said semiconductor substrate,
concurrently applying a first voltage in decreasing step wise increments from a ground reference potential to a first relatively large negative voltage level to said control gate, and
concurrently applying a second voltage in increasing step wise increments from the ground reference potential to a moderately large positive voltage level to said source; and
source erasing to remove charges from the floating gate electrode by the steps of:
continuing to maintain the first relatively large negative voltage level to the control gate electrode,
concurrently applying a moderately large positive voltage pulse to said semiconductor substrate, and
concurrently floating said drain region and said source region.

16. The non-volatile semiconductor memory device of claim 15 wherein the moderately large positive voltage level has a voltage range of from approximately 0.5V to a voltage level that is approximately a power supply voltage source.

17. The non-volatile semiconductor memory device of claim 15 wherein the moderately large positive voltage level has a first initial voltage increment that ranges from approximately 1.0 mV to approximately 1.0V.

18. The non-volatile semiconductor memory device of claim 17 wherein the moderately large positive voltage level has a first plurality of subsequent voltage increments that ranges from approximately 1.0 mV to approximately 1.0V.

19. The non-volatile semiconductor memory device of claim 18 wherein the first initial voltage increment and the first plurality of subsequent voltage increments have a time duration that ranges from approximately 1.0 m second to approximately 10 seconds.

20. The non-volatile semiconductor memory device of claim 15 wherein the relatively large negative voltage level has a voltage range of from approximately −5.0V to approximately −15.0V.

21. The non-volatile semiconductor memory device of claim 15 wherein the relatively large negative voltage level has a second initial voltage increment that ranges from approximately 1.0 mV to approximately 1.0V.

22. The non-volatile semiconductor memory device of claim 21 wherein relatively large negative voltage level has a second plurality of subsequent voltage increments that ranges from approximately 1.0 mV to approximately 1.0V.

23. The non-volatile semiconductor memory device of claim 22 wherein the second initial voltage increment and the second plurality of subsequent voltage increments have a time duration that ranges from approximately 1.0 m second to approximately 10 seconds.

24. The non-volatile semiconductor memory device of claim 15 wherein the moderately large positive voltage pulse has a voltage range of from approximately 1.0 mV to approximately 1.0V.

25. The non-volatile semiconductor memory device of claim 15 wherein the negative gate erasing and the source erasing each have a duration that ranges from approximately 1.0 m second to approximately 10 seconds.

26. A non-volatile semiconductor memory device comprising:
   a semiconductor substrate of a first conductivity type;
   a plurality of memory cells arranged in an array wherein each cell comprises:
      a pair of diffusions of a second conductivity type spaced distally from one another to form a source region and a drain region within said semiconductor substrate,
      a tunneling oxide insulation disposed upon said semiconductor substrate in a region generally between the source region and drain region in correspondence with a negative gate region and having a thickness which allows tunneling of carriers there through,
      a floating gate electrode disposed upon said tunneling oxide insulation generally in correspondence with said negative gate region,
      an inter-poly dielectric insulation disposed upon said floating gate electrode to insulate said floating gate, and
      a control gate electrode disposed upon said inter-poly dielectric insulation generally aligned with said floating gate; and
   an erasing means connected to said source region, drain region, control gate electrode, and semiconductor substrate to remove electrical charges from said floating gate electrode and to detrap trapped electrical charges from said tunneling oxide insulation to improve a separation factor of a programmed threshold voltage and an erased threshold voltage of said non-volatile semiconductor memory device by the steps of:
      negative gate erasing to detrap said tunneling oxide insulation by the steps of:
         floating said drain region,
         concurrently applying the ground reference potential to said semiconductor substrate,
         concurrently applying a first voltage in decreasing step wise increments from a ground reference potential to a first relatively large negative voltage level to said control gate, and
         concurrently applying a second voltage in increasing step wise increments from the ground reference potential to a moderately large positive voltage level to said source; and
      source erasing to remove charges from the floating gate electrode by the steps of:
         continuing to maintain the first relatively large negative voltage level to the gate control electrode,
         concurrently applying a moderately large positive voltage pulse to said semiconductor substrate, and
         concurrently floating said drain region and said source region.

27. The non-volatile semiconductor memory device of claim 26 wherein the moderately large positive voltage level has a voltage range of from approximately −0.5V to a voltage level that is approximately a power supply voltage source.

28. The non-volatile semiconductor memory device of claim 26 wherein the moderately large positive voltage level has a first initial voltage increment that ranges from approximately 1.0 mV to approximately 1.0V.

29. The non-volatile semiconductor memory device of claim 28 wherein the moderately large positive voltage level has a first plurality of subsequent voltage increments that ranges from approximately 1.0 mV to approximately 1.0V.

30. The non-volatile semiconductor memory device of claim 26 wherein the first initial voltage increment and the first plurality of subsequent voltage increments have a time duration that ranges from approximately 1.0 m second to approximately 10 seconds.

31. The non-volatile semiconductor memory device of claim 26 wherein the relatively large negative voltage level has a voltage range of from approximately −5.0V to approximately −15.0V.

32. The non-volatile semiconductor memory device of claim 26 wherein the relatively large negative voltage level has a second initial voltage increment that ranges from approximately 1.0 mV to approximately 1.0V.

33. The non-volatile semiconductor memory device of claim 32 wherein relatively large negative voltage level has a second plurality of subsequent voltage increments that ranges from approximately 1.0 mV to approximately 1.0V.

34. The non-volatile semiconductor memory device of claim 33 wherein the second initial voltage increment and the second plurality of subsequent voltage increments have a time duration that ranges from approximately 1.0 m second to approximately 10 seconds.

35. The non-volatile semiconductor memory device of claim 26 wherein the moderately large positive voltage pulse has a voltage range of from approximately 0.5V to approximately 5.0V.

36. The non-volatile semiconductor memory device of claim 26 wherein the negative gate erasing and the source erasing each have a duration that ranges from approximately 5 m seconds to approximately 1 second.

37. An erasing circuit to remove charges and to detrap charges from flash EEPROM cells, a source and a drain diffused into a semiconductor substrate, and a control gate, a floating gate, and a tunneling oxide disposed upon the semiconductor substrate, comprising:

a first voltage source coupled to the control gate;
a second voltage source coupled to the source region;
a third voltage source coupled to the drain region;
a fourth voltage source coupled to the semiconductor substrate;
an erasing control means coupled to the first, second, third, and fourth voltage sources to control said first, second, third, and fourth voltage sources, wherein a negative gate erasing to detrap said charges is accomplished by the steps of:
  disconnecting said third voltage source from the drain to float said drain,
  simultaneously forcing said fourth source to apply the ground reference potential to said semiconductor,
  simultaneously forcing said first voltage source in decreasing step wise increments from a ground reference potential to apply a relatively large negative voltage level to said control gate, and
  simultaneously forcing said second voltage source in increasing step wise increments from the ground reference potential to apply a moderately large positive voltage level to said source,
and wherein a source erasing to remove charges from said floating gate is accomplished by:
  forcing said first voltage source to continue to apply the relatively large negative voltage level to the control gate of said EEPROM cell,
  simultaneously disconnecting said second voltage source to float the source of said EEPROM cell,
  simultaneously disconnecting said third voltage source to float the drain of said EEPROM cell, and
  simultaneously forcing the fourth voltage sources to a ground reference potential to apply a moderately large positive voltage pulse to the semiconductor substrate.

38. The erasing circuit of claim 37 wherein channel erasing the flash EEPROM allows a separation of a programmed threshold voltage from an erased threshold voltage to be maintained over the repeated writing and erasing of said flash EEPROM, thus improving said write/erase threshold voltage closure.

39. The erasing circuit of claim 37 wherein the moderately large positive voltage level has a voltage range of from approximately 0.5V to a voltage level that is approximately a power supply voltage source.

40. The erasing circuit of claim 37 wherein the moderately large positive voltage level has a first initial voltage increment that ranges from approximately 1.0 mV to approximately 1.0V.

41. The erasing circuit of claim 40 wherein the moderately large positive voltage level has a first plurality of subsequent voltage increments that ranges from approximately 1.0 mV to approximately 1.0V.

42. The erasing circuit of claim 37 wherein the first initial voltage increment and the first plurality of subsequent voltage increments have a time duration that ranges from approximately 1.0 m second to approximately 10 seconds.

43. The erasing circuit of claim 37 wherein the relatively large negative voltage level has a voltage range of from approximately −5.0V to approximately −15.0V.

44. The erasing circuit of claim 43 wherein the relatively large negative voltage level has a second initial voltage increment that ranges from approximately 1.0 mV to approximately 1.0V.

45. The erasing circuit of claim 44 wherein relatively large negative voltage level has a second plurality of subsequent voltage increments that ranges from approximately 1.0 mV to approximately 1.0V.

46. The erasing circuit of claim 45 wherein the second initial voltage increment and the second plurality of subsequent voltage increments have a time duration that ranges from approximately 1.0 m second to approximately 10 seconds.

47. The erasing circuit of claim 37 wherein the moderately large positive voltage pulse has a voltage range of from approximately 0.5V to approximately 5.0V.

48. The erasing circuit of claim 37 wherein the negative gate erasing and the source erasing each have a duration that ranges from approximately 5 m seconds to approximately 1 second.

49. A method to erase a flash EEPROM cell, which is comprised of a control gate, a floating gate, a source, a drain, and a tunnel oxide disposed upon a semiconductor substrate, to improve a write/erase threshold voltage closure from repeatedly writing and erasing said flash EEPROM cell, comprising the steps of:
  source erasing said flash EEPROM cell by the steps of,
    applying a voltage in increasing step wise increments from the ground reference potential to apply a relatively large positive voltage level to the source of said EEPROM cell,
    simultaneously applying a ground reference voltage to the control gate and to the semiconductor substrate,
    simultaneously floating said drain; and then
  channel erasing said flash EEPROM cell by the steps of:
    floating said source and drain,
    applying a moderately high positive voltage pulse to said semiconductor substrate,
    simultaneously applying a relatively large negative voltage pulse to said control gate.

50. The method to erase a flash EEPROM cell of claim 49 wherein source erasing the flash EEPROM removes charges from the floating gate.

51. The method to erase a flash EEPROM cell of claim 49 wherein channel erasing the flash EEPROM removes charges trapped in the tunnel oxide between the floating gate and the semiconductor substrate.

52. The method to erase a flash EEPROM cell of claim 49 wherein the source erasing followed by the channel erasing the flash EEPROM allows a separation of a programmed threshold voltage from an erased threshold voltage to be maintained over the repeated writing and erasing of said flash EEPROM, thus improving said write/erase threshold voltage closure.

53. The method to erase a flash EEPROM cell of claim 49 wherein the first relatively large positive voltage level has a voltage of from approximately 5.0V to approximately 10.0V.

54. The method to erase a flash EEPROM cell of claim 49 wherein the moderately high voltage pulse has a voltage of from approximately 0.5V to approximately 5.0V.

55. The method to erase a flash EEPROM cell of claim 49 wherein the relatively large negative voltage pulse has a voltage of from approximately −5.0V to approximately −15.0V.

56. The method to erase a flash EEPROM cell of claim 49 wherein the relatively large positive voltage level, the moderately high positive voltage pulse, and the relatively large negative voltage pulse each have a duration of from approximately 10 m seconds to approximately 100 m seconds.

57. A non-volatile semiconductor memory device comprising:

a semiconductor substrate of a first conductivity type;

a pair of diffusions of a second conductivity type spaced distally from one another to form a source region and a drain region within said semiconductor substrate;

a tunnel oxide insulation disposed upon said semiconductor substrate in a region generally between the source region and drain region in correspondence with a channel region and having a thickness which allows tunneling of carriers there through;

a floating gate electrode disposed upon said tunnel oxide insulation generally in correspondence with said channel region;

an inter-poly dielectric insulation disposed upon said floating gate electrode to insulate said floating gate;

a control gate electrode disposed upon said inter-poly dielectric insulation generally aligned with said floating gate; and an erasing means to remove electrical charges from said floating gate electrode and to detrap trapped electrical charges from said tunnel oxide insulation to improve a separation factor of a programmed threshold voltage and an erased threshold voltage of said non-volatile semiconductor memory device wherein charges are removed from the floating gate by the steps of:

source erasing said flash EEPROM cell by the steps of,
applying in increasing step wise increments from the ground reference potential to apply a relatively large positive voltage level to the source of said EEPROM cell,
simultaneously applying a ground reference voltage to the control gate and to the semiconductor substrate,
simultaneously floating said drain; and then channel erasing said flash EEPROM cell by the steps of:
floating said source and drain,
applying a moderately high positive voltage pulse to said semiconductor substrate,
simultaneously applying a relatively large negative voltage pulse to said control gate.

58. The non-volatile semiconductor memory device of claim 57 wherein the relatively large voltage level has a voltage of from approximately 5.0V to approximately 10.0V.

59. The non-volatile semiconductor memory device of claim 57 wherein the moderately high positive voltage pulse has a voltage of from approximately 0.5V to approximately 5.0V.

60. The non-volatile semiconductor memory device of claim 57 wherein the relatively large negative voltage pulse has a voltage of from approximately −5.0V to approximately −15.0V.

61. The non-volatile semiconductor memory device of claim 57 wherein the relatively large positive voltage level, the moderately high positive voltage pulse, and the relatively large negative voltage pulse each have a duration of from approximately 10 m seconds to approximately 100 m seconds.

62. A non-volatile semiconductor memory device comprising:

a semiconductor substrate of a first conductivity type;

a plurality of memory cells arranged in an array wherein each cell comprises:
a pair of diffusions of a second conductivity type spaced distally from one another to form a source region and a drain region within said semiconductor substrate, a tunnel oxide insulation disposed upon said semiconductor substrate in a region generally between the source region and drain region in correspondence with a channel region and having a thickness which allows tunneling of carriers there through, a floating gate electrode disposed upon said tunnel oxide insulation generally in correspondence with said channel region, an inter-poly dielectric insulation disposed upon said floating gate electrode to insulate said floating gate, and a control gate electrode disposed upon said inter-poly dielectric insulation generally aligned with said floating gate; and an erasing means to remove electrical charges from said floating gate electrode and to detrap trapped electrical charges from said tunnel oxide insulation to improve a separation factor of a programmed threshold voltage and an erased threshold voltage of said non-volatile semiconductor memory device wherein charges are removed from the floating gate by the steps of:

source erasing said flash EEPROM cell by the steps of,
applying in increasing step wise increments from the ground reference potential to apply a relatively large positive voltage level to the source of said EEPROM cell,
simultaneously applying a ground reference voltage to the control gate and to the semiconductor substrate,
simultaneously floating said drain; and then channel erasing said flash EEPROM cell by the steps of:
floating said source and drain,
applying a moderately high positive voltage pulse to said semiconductor substrate,
simultaneously applying a relatively large negative voltage pulse to said control gate.

63. The non-volatile semiconductor memory device of claim 62 wherein the relatively large positive voltage level has a voltage of from approximately 5.0V to approximately 10.0V.

64. The non-volatile semiconductor memory device of claim 62 wherein the moderately high positive voltage pulse has a voltage of from approximately 0.5V to approximately 5.0V.

65. The non-volatile semiconductor memory device of claim 62 wherein the relatively large negative voltage pulse has a voltage of from approximately −5.0V to approximately −15.0V.

66. The non-volatile semiconductor memory device of claim 62 wherein the relatively large positive voltage level, the moderately high positive voltage pulse, and the relatively large negative voltage pulse each have a duration of from approximately 10 m seconds to approximately 100 m seconds.

67. An erasing means to remove charges and to detrap charges from flash EEPROM cells, wherein a flash EEPROM cell comprises a drain region, a source region, a floating gate, a control gate, a tunnel oxide, and an inter-poly dielectric disposed upon a semiconductor substrate, comprising:

a first source coupled to the control gate;

a second voltage source coupled to the source region;

a third voltage source coupled to the drain region;

a fourth voltage source coupled to the semiconductor substrate; and an erasing control means coupled to the first, second, third, and fourth voltage sources to control said first, second, third, and fourth voltage sources to remove the charges and to detrap the charges from flash EEPROM cells by the steps of:

source erasing to remove the charges by steps of:
forcing said second voltage source in increasing step wise increments from the ground reference potential to apply a relatively large positive voltage level to the source region,
simultaneously forcing the first and fourth voltage sources to a ground reference voltage to place the control gate and the semiconductor substrate at the ground reference potential, and
simultaneously forcing the third voltage source to a floating condition to float the drain region; and channel erasing to detrap said charges by the steps of:
forcing said third source to a floating condition to float the drain,
simultaneously forcing said fourth voltage source to apply a moderately high positive voltage pulse to said semiconductor substrate, and
simultaneously forcing said first voltage source to apply a relatively large negative voltage pulse to said control gate.

68. The erasing means of claim 67 wherein the source erasing followed by the channel erasing the flash EEPROM allows a separation of a programmed threshold voltage from an erased threshold voltage to be maintained over the repeated writing and erasing of said flash EEPROM, thus improving said write/erase threshold voltage closure.

69. The erasing means of claim 67 wherein the relatively large positive voltage level has a voltage of from approximately 5.0V to approximately 10.0V.

70. The erasing means of claim 67 wherein the moderately high positive voltage pulse has a voltage of from approximately 0.5V to approximately 5.0V.

71. The erasing means of claim 67 wherein the relatively large negative voltage level has a voltage of from approximately −5.0V to approximately −15.0V.

72. The erasing means of claim 67 wherein the relatively large positive voltage pulse, the moderately high positive voltage pulse, and the relatively large negative voltage pulse each have a duration of from approximately 10 m seconds to 100 m seconds.

* * * * *